US009929034B2

United States Patent
Goto et al.

(10) Patent No.: US 9,929,034 B2
(45) Date of Patent: Mar. 27, 2018

(54) SUBSTRATE TRANSFER DEVICE

(71) Applicants: KAWASAKI JUKOGYO KABUSHIKI KAISHA, Kobe-shi, Hyogo (JP); KAWASAKI ROBOTICS (USA), INC., Wixom, MI (US)

(72) Inventors: Hirohiko Goto, Akashi (JP); Ming Zeng, San Jose, CA (US); Avish Bharwani, Santa Clara, CA (US); Shigeki Ono, Campbell, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 148 days.

(21) Appl. No.: 14/844,819

(22) Filed: Sep. 3, 2015

(65) Prior Publication Data

US 2017/0069517 A1    Mar. 9, 2017

(51) Int. Cl.
G05B 19/04    (2006.01)
G05B 19/18    (2006.01)
(Continued)

(52) U.S. Cl.
CPC .. *H01L 21/67766* (2013.01); *H01L 21/67778* (2013.01); *H01L 21/681* (2013.01); *H01L 21/68707* (2013.01)

(58) Field of Classification Search
CPC ............ H01L 21/68707; H01L 21/681; H01L 21/67778; H01L 21/67766;
(Continued)

(56) References Cited

U.S. PATENT DOCUMENTS 5,934,856 A * 8/1999 Asakawa ................ C23C 16/54
414/217
2007/0020082 A1* 1/2007 Caveney ........... H01L 21/67766
414/744.5
(Continued)

FOREIGN PATENT DOCUMENTS

JP    H10-6267 A    1/1998
JP    2007-169007 A    7/2007
(Continued)

OTHER PUBLICATIONS

Apr. 17, 2017, Office Action issued in Taiwanese Patent Application No. 105128627.

Primary Examiner — Rachid Bendidi
(74) Attorney, Agent, or Firm — Oliff PLC

(57) ABSTRACT

A substrate transfer device includes a casing and a substrate conveying robot. A size of the casing in a second direction Y is more than a size of the casing in a first direction X. The casing includes walls forming a conveying chamber and at least one opening or provided at at least one side of the conveying chamber in the first direction X. The substrate conveying robot includes a base, a robot arm, a robot hand, and a controller. When a space in the conveying chamber except for a predetermined exclusive region is defined as an effective conveying chamber, an entire link length DL of a link is less than a conveying chamber size Dx, and an entire hand length Dh of the robot hand is not less than an effective conveying chamber size Dx'.

9 Claims, 15 Drawing Sheets

(51) Int. Cl.
*H01L 21/677* (2006.01)
*H01L 21/68* (2006.01)
*H01L 21/687* (2006.01)

(58) Field of Classification Search
CPC ....... H01L 21/67772; B25J 9/02; B25J 9/042; G05B 2219/45032; G05B 2219/39082; Y10T 29/53435; Y10T 29/5337; Y10T 29/53365
See application file for complete search history.

(56) References Cited

U.S. PATENT DOCUMENTS

2013/0195601 A1* 8/2013 Shin .......................... B25J 9/02
 414/744.5
2014/0210224 A1* 7/2014 Hashimoto ....... H01L 21/67742
 294/213

FOREIGN PATENT DOCUMENTS

| JP | 2008-028134 A | 2/2008 |
|----|---------------|--------|
| TW | 200914221 A | 4/2009 |
| TW | 201342516 A | 10/2013 |

\* cited by examiner

SUBSTRATE TRANSFER DEVICE

TECHNICAL FIELD

The present invention relates to a substrate transfer device configured to transfer substrates, such as semiconductor substrates or glass substrates, from a carrier to a process apparatus.

BACKGROUND ART

Conventionally known is a substrate treatment facility configured to perform process treatments, such as formation of an element, with respect to a semiconductor substrate (hereinafter may be simply referred to as a "substrate") that is a semiconductor element manufacturing material. Typically, the substrate treatment facility is provided with a process treatment device, a substrate transfer device provided adjacent to the process treatment device, and the like.

For example, a substrate transfer device described in Japanese Unexamined Patent Application Publication No. 2008-28134 (PTL 1) includes: a casing in which a conveying chamber is formed; a plurality of load ports provided at a front wall of the casing; and a substrate conveying robot provided in the conveying chamber. The substrate conveying robot includes a robot arm and a robot hand coupled to a wrist of the robot arm. For example, the substrate conveying robot loads the substrate into the process treatment device, unloads the substrate from the process treatment device, takes out the substrate stored in a sealable substrate carrier for interprocess conveyance, and stores the substrate in the substrate carrier. Examples of the substrate transfer device include a front end module (Equipment Front End Module; abbreviated as EFEM) and a sorter. One example of the substrate carrier is a FOUP (Front Opening Unified Pod).

To improve throughput of the substrate transfer device, a plurality of substrate carriers are coupled to one conveying chamber. Therefore, the number of load ports provided at the front wall of the casing corresponds to the number of substrate carriers communicating with the conveying chamber. As a result, a width of the substrate transfer device (i.e., a width of the casing) tends to be wide. On the other hand, to reduce the size of the substrate transfer device, a reduction in depth of the substrate transfer device is desired.

An entire link length of each of links constituting the robot arm of the substrate conveying robot is limited by the depth of the substrate transfer device. Proposed is a technology of expanding a movable range of the robot hand based on the limited entire link length of each of the links of the robot arm. For example, in each of Japanese Unexamined Patent Application Publication No. 10-6267 (PTL 2) and Japanese Unexamined Patent Application Publication No. 2007-169007 (PTL 3), proposed is a substrate conveying robot configured such that a robot hand or a tip end portion of the robot hand can linearly move forward and backward relative to a wrist portion of a robot arm while maintaining a constant posture.

CITATION LIST

Patent Literature

[PTL 1] Japanese Unexamined Patent Application Publication No. 2008-28134
[PTL 2] Japanese Unexamined Patent Application Publication No. 10-6267
[PTL 3] Japanese Unexamined Patent Application Publication No. 2007-169007

SUMMARY OF INVENTION

Technical Problem

In the conventional substrate transfer device, the substrate carrier coupled to the casing is open in the conveying chamber in a direction parallel to a depth direction. When the robot hand enters into or gets out from the substrate carrier, the robot hand moves in the conveying chamber and the substrate carrier in a direction parallel to the depth direction. An "entire hand length" denotes a longitudinal size of the robot hand including the substrate held by the robot hand. Specifically, the "entire hand length" denotes a size from a base end of the robot hand to a tip end of the substrate held by the robot hand.

It was thought that the entire hand length of the robot hand which operates as above was limited by the depth of the substrate transfer device. More specifically, an exclusive region for operations of the load ports was defined in the conveying chamber, and it was thought that the entire hand length of the robot hand should be less than a depth of a space in the conveying chamber except for the exclusive region.

The present invention was made in light of these circumstances, and an object of the present invention is to propose a technology of easily realizing a reduction in depth of a conveying chamber in a substrate transfer device.

Solution to Problem

A substrate transfer device according to one aspect of the present invention includes: a casing configured such that when a certain horizontal direction is defined as a first direction, and another horizontal direction orthogonal to the first direction is defined as a second direction, a size of the casing in the second direction is more than a size of the casing in the first direction, the casing including walls forming a conveying chamber and at least one opening provided at at least one side of the conveying chamber in the first direction; and a substrate conveying robot including a base provided in the conveying chamber, a robot arm constituted by at least one link supported by the base, a robot hand coupled to a wrist portion of the robot arm and configured to hold a substrate, and a controller configured to control operations of the robot arm and the robot hand, wherein when a space in the conveying chamber except for a predetermined exclusive region is defined as an effective conveying chamber, an entire link length of the at least one link is less than a size of the conveying chamber in the first direction, and an entire hand length of the robot hand is not less than a size of the effective conveying chamber in the first direction.

In the substrate transfer device, the size of the conveying chamber in the first direction is limited by not the entire hand length of the robot hand of the substrate conveying robot but the entire link length of each link of the robot arm. The reduction in the entire link length of the link of the substrate conveying robot can be realized more easily than the reduction in the entire hand length by including a traveling shaft in the substrate conveying robot for allowing the substrate conveying robot to travel in the second direction Y or by increasing the number of links of the substrate conveying robot. Therefore, the reduction in the size of the conveying chamber in the first direction can be easily realized.

Advantageous Effects of Invention

According to the present invention, the reduction in the size (depth) of the conveying chamber of the substrate transfer device in the first direction can be easily realized.

DESCRIPTION OF EMBODIMENTS

Schematic Configuration of Substrate Treatment Facility 100

Figure 1:
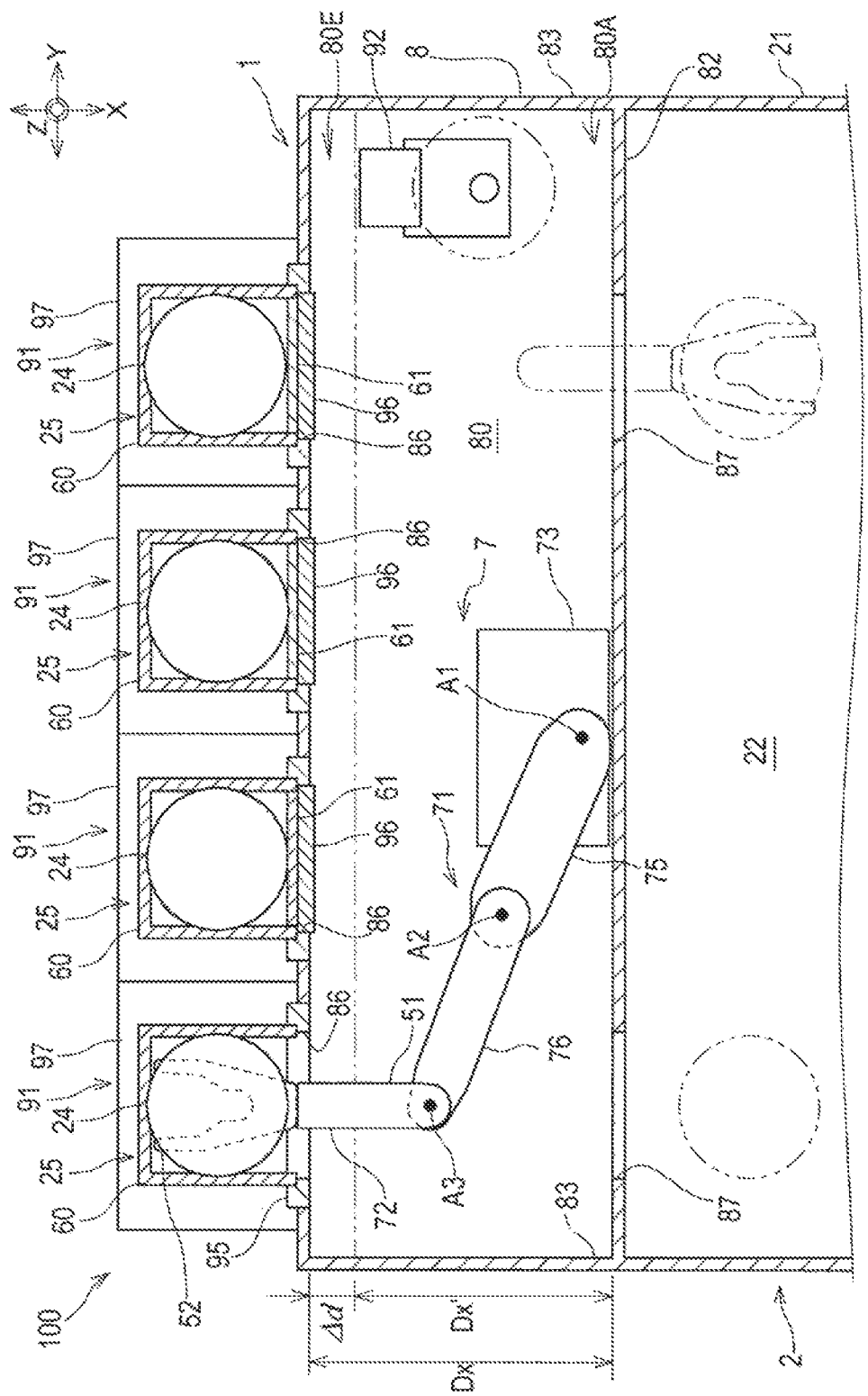
FIG. 1 is a plane cross-sectional view showing a schematic configuration of a substrate treatment facility including a substrate transfer device according to one embodiment of the present invention.
Figure 2:
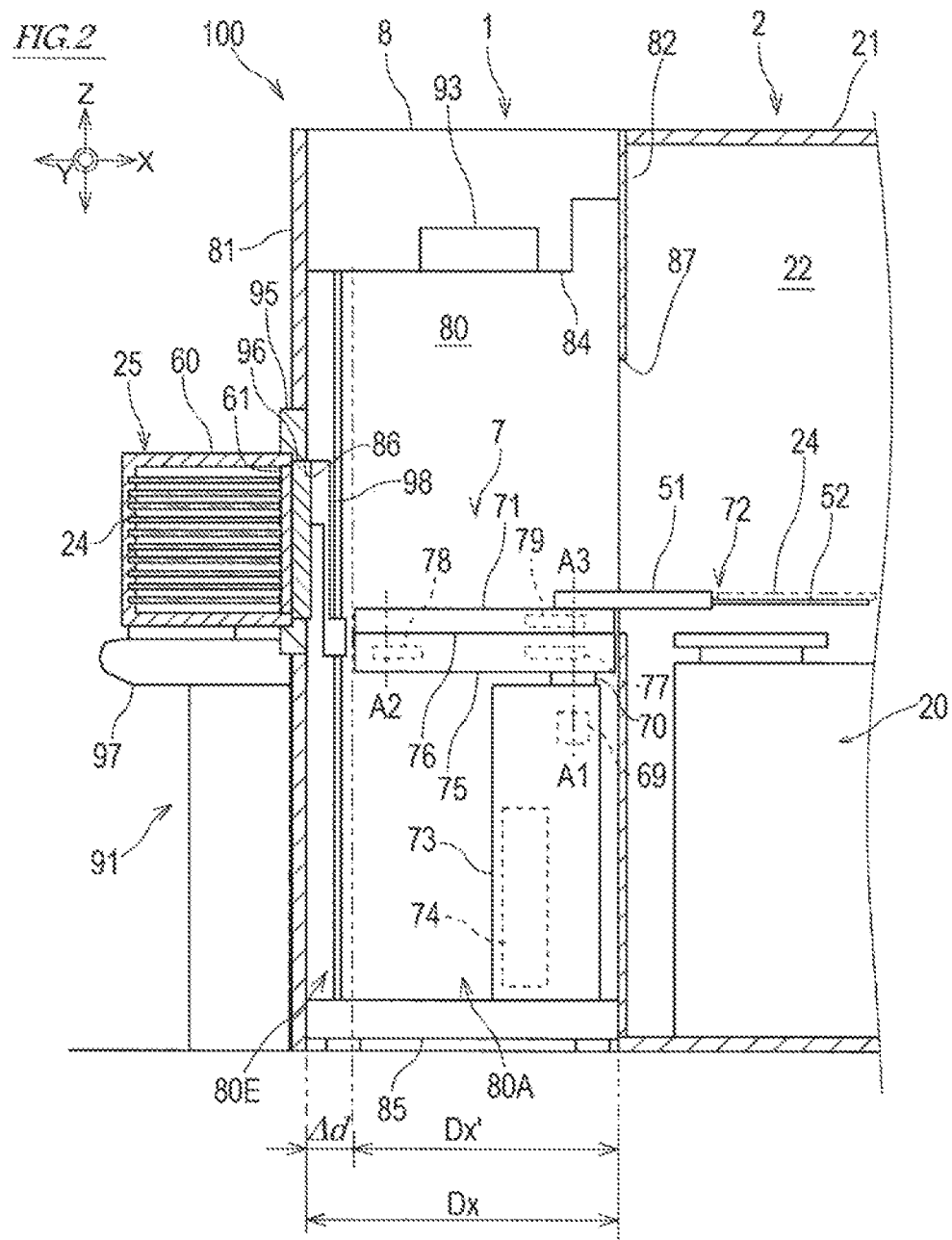
FIG. 2 is a side cross-sectional view showing a schematic configuration of the substrate treatment facility shown in FIG. 1.

First, the following will explain a schematic configuration of a substrate treatment facility 100 including a substrate transfer device 1 according to one embodiment of the present invention. FIG. 1 is a plane cross-sectional view showing the schematic configuration of the substrate treatment facility 100 including the substrate transfer device 1 according to one embodiment of the present invention. FIG. 2 is a side cross-sectional view showing the schematic configuration of the substrate treatment facility 100 shown in FIG. 1. As shown in FIGS. 1 and 2, the substrate treatment facility 100 includes the substrate transfer device 1 and a process treatment device 2. The substrate treatment facility 100 is designed so as to conform to rules such as SEMI (Semiconductor Equipment and Materials International) standards.

The process treatment device 2 is a device or a group of devices, which performs a process treatment with respect to a substrate 24, the process treatment being at least one of a heat treatment, an impurity introducing treatment, a thin film forming treatment, a lithography treatment, a washing treatment, and a flattening treatment. It should be noted that the process treatment device 2 may perform a treatment other than the above treatments with respect to the substrate 24.

The process treatment device 2 includes: a treatment device main body 20 configured to perform a treatment with respect to the substrate 24; a casing 21 accommodating the treatment device main body 20; and an adjuster (not shown) configured to adjust an atmospheric gas of a treatment chamber 22 formed in the casing 21. The adjuster may be realized by, for example, a fan filter unit.

The substrate transfer device 1 is provided adjacent to the process treatment device 2. The substrate transfer device 1 serves as an interface portion configured to transfer the substrate 24 between each substrate carrier 25 and the process treatment device 2. The substrate carrier 25 is a portable container capable of storing a large number of substrates 24.

The substrate carrier 25 includes: a container main body 60 storing the substrates 24; and a container door 61 which can be attached to and detached from the container main body 60 or can open and close the container main body 60. The container main body 60 has a substantially box shape including an entrance which is open toward one side, and this entrance is openably closed by the container door 61. A large number of shelves lined up in an upward/downward direction Z are formed in the container main body 60 such that a large number of substrates 24 are stored in the container main body 60 so as to be lined up at regular intervals in the upward/downward direction Z.

Substrate Transfer Device 1

Next, the substrate transfer device 1 will be explained in detail. The substrate transfer device 1 includes: a substrate conveying robot 7; an aligner 92 configured to align directions of the substrates 24; an adjuster 93; a casing 8 configured to accommodate these members; and load ports 91.

The casing 8 has a rectangular parallelepiped shape, and a size of the rectangular parallelepiped shape in a second direction Y is more than a size of the rectangular parallelepiped shape in a first direction X. The "first direction X" is a certain horizontal direction, and the "second direction Y" is another horizontal direction orthogonal to the first direction X. The casing 8 includes: a front wall 81 and rear wall 82 opposing each other so as to be spaced apart from each other in the first direction X; a pair of side walls 83 opposing each other so as to be spaced apart from each other in the second direction Y; a ceiling plate 84, and a bottom plate 85, and a conveying chamber 80 is formed in the casing 8 by these walls and plates. In the present description, the word "front" denotes one side in the first direction X, the side being a side where the front wall 81 exists when viewed from the conveying chamber 80, and the word "rear" denotes an opposite side in the first direction X.

The conveying chamber 80 is a closed space having high cleanliness and is filled with a predetermined atmospheric gas. The adjuster 93 is a device configured to perform contamination control of the conveying chamber 80. A level of floating fine particles in an atmosphere of the conveying chamber 80 is managed to not more than a predetermined cleanliness level by the adjuster 93, and according to need, environmental conditions, such as temperature, humidity, and pressure, in the conveying chamber 80 are also managed.

The rear wall 82 is provided with a plurality of rear openings 87. In the present embodiment, two rear openings 87 lined up in the second direction Y are provided. The treatment chamber 22 of the process treatment device 2 and the conveying chamber 80 of the substrate transfer device 1 are separated from each other by the rear wall 82 in the first direction X. The treatment chamber 22 and the conveying chamber 80 communicate with each other through the rear openings 87.

The load ports 91 are provided at the front wall 81 of the casing 8. In the present embodiment, four load ports 91 lined up in the second direction Y are provided at the front wall 81. Each of the load ports 91 has functions of: performing docking and undocking of the substrate carrier 25 and the substrate transfer device 1; supporting the substrate carrier 25; opening and closing the substrate carrier 25; and the like.

The load port 91 includes an opening frame 95, a support base 97, and an opener 98. The opening frame 95 constitutes a part of the front wall 81 of the casing 8, and a front opening 86 of the casing 8 is defined by the opening frame 95. The substrate carrier 25 which docked with the substrate transfer device 1 and the conveying chamber 80 communicate with each other through the front opening 86 formed on the front wall 81 of the casing 8.

The support base 97 is provided right in front of the front opening 86 and has a function of supporting the substrate carrier 25 placed on the support base 97 and a function of holding the substrate carrier 25. The substrate carrier 25 placed on and held by the support base 97 is positioned such that: an entire periphery of the entrance of the container main body 60 contacts the opening frame 95; and the container door 61 overlaps the front opening 86 in the first direction X.

The opener 98 includes: an opener door 96 configured to open and close the front opening 86; and a drive mechanism for the opener door 96. The opener 98 causes the container door 61 of the substrate carrier 25 and the opener door 96 to integrally move into the conveying chamber 80 to open the front opening 86.

Figure 3:
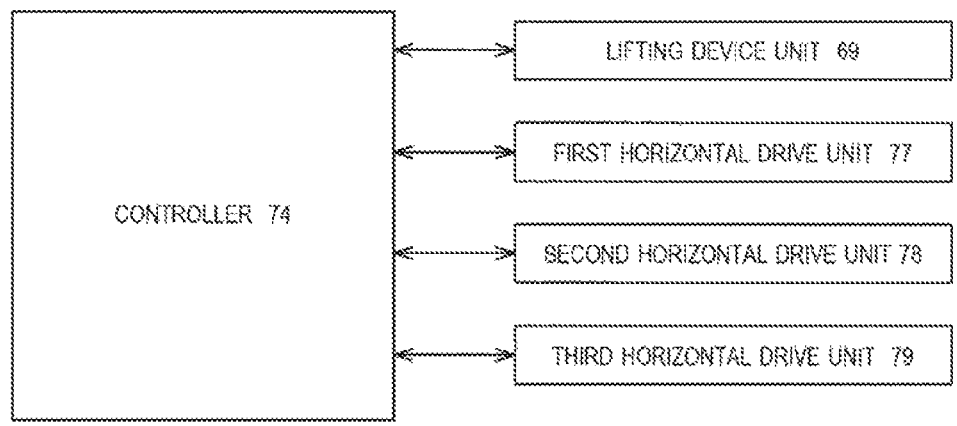
FIG. 3 is a block diagram showing a configuration of a control system of a substrate conveying robot.

FIG. 3 is a block diagram showing the configuration of a control system of the substrate conveying robot 7. As shown in FIGS. 1 to 3, the substrate conveying robot 7 includes a robot arm (hereinafter simply referred to as an "arm 71"), a robot hand (hereinafter simply referred to as a "hand 72") that is one example of an end effector coupled to a wrist portion of the arm 71; a base 73 supporting the arm 71, and a controller 74 configured to control operations of the substrate conveying robot 7. The substrate conveying robot 7 according to the present embodiment is a horizontal articulated robot. The base 73 is provided at a substantially center position in the conveying chamber 80 in the second direction Y and at a position behind a center position in the conveying chamber 80 in the first direction X.

The arm 71 includes a plurality of links 75 and 76 sequentially coupled to one another from a base end toward a tip end. In the arm 71, joint axes A1 to A3 corresponding to the links 75 and 76 are defined. Horizontal drive units 77, 78, and 79 are provided in the links 75 and 76 and cause the links 75 and 76 to be individually and angularly displaced around the joint axes A1 to A3. For example, regarding each joint, each of the horizontal drive units 77, 78, and 79 includes: a servo motor configured to be angularly displaced in accordance with a signal transmitted from the controller 74; a power transmission mechanism configured to transmit power of the servo motor to a link body; and a position detector configured to detect the angular displacement of the servo motor (which are not shown).

The arm 71 includes a lifting shaft 70. The lifting shaft 70 is provided at a base end portion of the arm 71 and is movable relative to the base 73 in the upward/downward direction Z. The lifting shaft 70 is caused to expand and contract by a lifting drive unit 69 in the upward/downward direction Z relative to the base 73. For example, the lifting drive unit 69 includes: a servo motor configured to be angularly displaced in accordance with a signal transmitted from the controller 74; a power transmission mechanism configured to convert power of the servo motor into linear force to transmit the linear force to the lifting shaft 70; a position detector configured to detect the angular displacement of the servo motor (which are not shown).

The hand 72 is coupled to the wrist portion that is a tip end portion of the arm 71 configured as above. The hand 72 is rotated and displaced relative to the arm 71 around the joint axis A3 by the horizontal drive unit 79. The hand 72 includes: a hand base portion 51 coupled to the wrist portion of the arm 71; and a blade 52 coupled to the hand base portion 51. The substrate 24 is placed on the blade 52.

The hand 72 further includes a holding structure configured to cause the blade 52 to hold the substrate 24 placed on the blade 52. The holding of the substrate 24 includes a case where the substrate 24 placed on the blade 52 is prevented from falling down from the blade 52 by engagement, adsorption, sandwiching, or the other method.

The controller 74 is a so-called calculation control device including a computer. The controller 74 includes a calculation processing portion and a storage portion (both not shown). Examples of the calculation processing portion includes a microcontroller, a CPU, a MPU, a PLC, a DSP, an ASIC, and a FPGA, and examples of the storage portion includes a ROM and a RAM. The storage portion stores programs executed by the calculation processing portion, various fixed data, and the like. The storage portion further stores: teaching point data for controlling operations of the substrate conveying robot 7; data regarding the shapes and sizes of the arm 71 and the hand 72; data regarding the shape and size of the substrate 24 held by the hand 72; and the like. In the controller 74, the calculation processing portion reads out and executes software such as the program stored in the storage portion. Thus, the controller 74 performs processing for controlling the operations of the substrate conveying robot 7. It should be noted that the controller 74 may execute each processing by centralized control performed by a single computer or by distributed control performed by cooperation of a plurality of computers.

Based on a pose (position and posture) of the hand 72 corresponding to a rotational position detected by the position detectors and the teaching point data stored in the storage portion, the controller 74 calculates a target pose that is a pose after a predetermined control time. The controller 74 outputs a control command to a servo amplifier such that the pose of the hand 72 becomes the target pose after the predetermined control time. Based on the control command, the servo amplifier supplies drive electric power to each servo motor. With this, the hand 72 can be caused to become a desired pose.

In the substrate transfer device 1 configured as above, the conveying chamber 80 includes an exclusive region 80E into which the substrate conveying robot 7 cannot enter. The exclusive region 80E is a region spreading from the front wall 81 of the casing 8 by a predetermined size Δd. The exclusive region 80E is utilized by the load port 91 (opener 98) for opening/closing operations of the substrate carrier 25 and the front opening 86. When the substrate carrier 25 and the front opening 86 are open, the container door 61, the opener door 96, and the drive mechanism for the opener door 96 exist in the exclusive region 80E. Therefore, the substrate conveying robot 7 which may interfere with these members should not enter into the exclusive region 80E.

A space in the conveying chamber 80 except for the exclusive region 80E is defined as an "effective conveying chamber 80A". The effective conveying chamber 80A is a space which can be utilized by the substrate conveying robot 7 in the conveying chamber 80. In the present embodiment, the exclusive region 80E is defined along the front wall 81 in the conveying chamber 80. However, exclusive regions may be defined along respective front and rear walls 81 and 82 in the conveying chamber 80. The opener 98 does not exist at the rear wall 82 of the casing 8. However, by defining the exclusive region along the rear wall 82 of the casing 8, the interference between the rear wall 82 of the casing 8 and the hand 72 can be more surely avoided, and the hand 72 can move smoothly.

For convenience of explanation, a size of the conveying chamber 80 in the first direction X is referred to as a "conveying chamber size Dx", and a size of the effective conveying chamber 80A in the first direction X is referred to as an "effective conveying chamber size Dx' (Dx'=Dx−Δd)". The conveying chamber size Dx is substantially equal to a distance from the front wall 81 of the casing 8 to the rear wall 82 of the casing 8.

Figure 4:
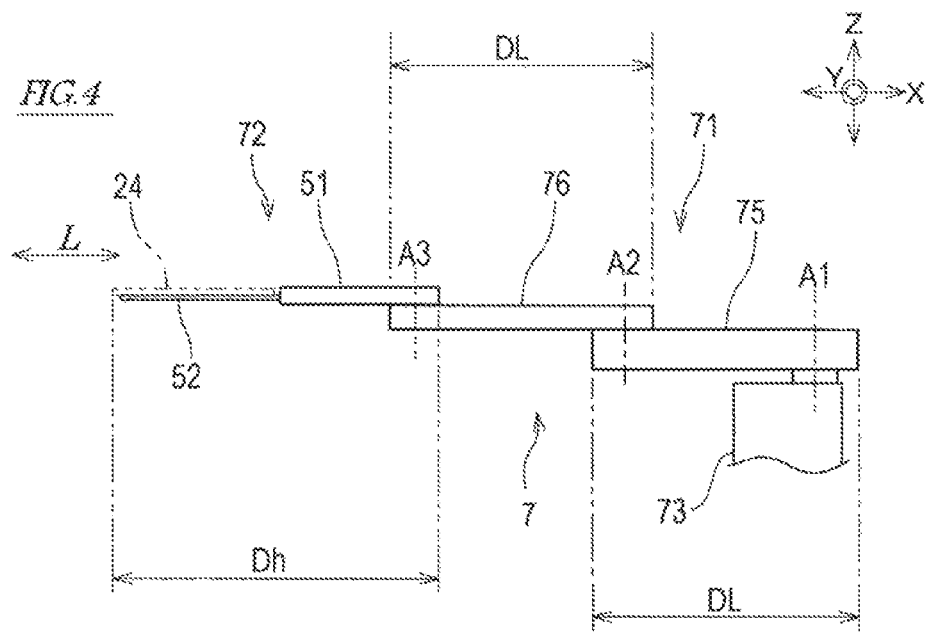
FIG. 4 is a side view for explaining an entire link length and entire hand length of the substrate conveying robot.

In the foregoing, an entire link length DL of each of the links 75 and 76 of the arm 71 of the substrate conveying robot 7 is less than the conveying chamber size Dx. More preferably, the entire link length DL is less than the effective conveying chamber size Dx'. The entire link length DL of the link 75 and the entire link length DL of the link 76 may be different from each other. As shown in FIG. 4, the "entire link length DL" of the link 75 is a maximum value of a size of the link 75 in a direction orthogonal to two joint axes A1 and A2 defined at the link 75 (i.e., a longitudinal size of the link 75). The "entire link length DL" of the link 76 is a maximum value of a size of the link 76 in a direction orthogonal to two joint axes A2 and A3 defined at the link 76 (i.e., a longitudinal size of the link 76).

Further, an entire hand length Dh of the hand 72 of the substrate conveying robot 7 is not less than the effective conveying chamber size Dx'. The entire hand length Dh of the hand 72 is less than a size obtained by adding a distance (hereinafter referred to as a "hand insertion size") to the conveying chamber size Dx, the hand insertion size being a distance from an inner surface of the wall 81 to a point of the hand 72 which is inserted in the substrate carrier 25 or a point of the substrate 24 held by the hand 72, the point being farthest from the inner surface of the wall in the first direction X. More preferably, the entire hand length Dh is not less than the conveying chamber size Dx and less than the size obtained by adding the hand insertion size to the conveying chamber size Dx. As shown in FIG. 4, the "entire hand length Dh" of the hand 72 is a maximum value of a size of the hand 72 (including the substrate 24 held by the hand 72) in a direction orthogonal to the joint axis A3 defined at the hand 72. To be specific, the entire hand length Dh is a length in a hand longitudinal direction L from a base end of the hand base portion 51 to a tip end of the substrate 24 held by the blade 52. The hand longitudinal direction L is a direction along a straight line connecting a base end portion and tip end portion of the hand 72.

Each of FIGS. 1 and 2 is a reduced scale view of the substrate transfer device 1 in which a diameter of the substrate 24 is 300 mm, the conveying chamber size Dx is 650 mm, the effective conveying chamber size Dx' is 550 mm, and the insertion size is 350 mm. The entire hand length Dh of the hand 72 of the substrate conveying robot 7 included in the substrate transfer device 1 is not less than 550 mm and less than 900 mm. More preferably, the entire hand length Dh is not less than 650 mm and less than 900 mm. The entire link length DL of each of the links 75 and 76 of the arm 71 of the substrate conveying robot 7 is less than 650 mm, and more preferably, less than 550 mm. Each of FIGS. 1 and 2 is a reduced scale view of the substrate conveying robot 7 in which the entire hand length Dh of the hand 72 is 650 mm, and the entire link length DL of each of the links 75 and 76 is 550 mm.

As explained above, the substrate transfer device 1 according to the present embodiment includes the casing 8 and the substrate conveying robot 7 provided in the casing 8. The size of the casing 8 in the second direction Y is more than the size of the casing 8 in the first direction X. The casing 8 includes the walls (the front wall 81, the rear wall 82, and the side walls 83) forming the conveying chamber 80 and at least one opening (the front opening 86 or the rear opening 87) provided at at least one side of the conveying chamber 80 in the first direction X. The substrate conveying robot 7 includes: the base 73 provided in the conveying chamber 80; the robot arm 71 constituted by at least one link 75 or 76 supported by the base 73; the robot hand 72 coupled to the wrist portion of the robot arm 71 and capable of holding the substrate 24; and the controller 74 configured to control the operations of the robot arm 71 and the robot hand 72. When the space in the conveying chamber 80 except for the predetermined exclusive region 80E is defined as the effective conveying chamber 80A, the entire link length DL of at least one link 75 or 76 is less than the size (conveying chamber size Dx) of the conveying chamber 80 in the first direction X, and the entire hand length Dh of the robot hand 72 is not more than the size (effective conveying chamber size Dx') of the effective conveying chamber 80A in the first direction X.

The substrate transfer device 1 according to the present embodiment further includes the load ports 91 each configured to open and close the front opening 86. The region utilized by the load ports 91 for the opening/closing operations of the substrate carriers 25 communicating with the conveying chamber 80 through the load ports 91 is defined as the predetermined exclusive region 80E.

According to the substrate transfer device 1, the conveying chamber size Dx is limited by not the entire hand length Dh but the entire link length DL. The entire link length DL is generally related to a required operation range of the substrate conveying robot 7 in the second direction Y. By including a traveling shaft in the substrate conveying robot 7 for allowing the substrate conveying robot 7 to travel in the second direction Y or by increasing the number of links of the substrate conveying robot 7, the operation range of the substrate conveying robot 7 in the second direction Y can be expanded regardless of the entire link length DL.

On the other hand, the reduction in the entire hand length Dh is restricted by: the diameter of the substrate 24 held by the hand 72; a length for a mechanism for coupling the hand 72 to the arm 71; a distance from the tip end of the arm 71 to the entrance of the substrate carrier 25 when the tip end of the arm 71 is closest to the front opening 86 or the rear opening 87; and the like. As above, the entire hand length Dh of the hand 72 is variously restricted, so that it is difficult to shorten the entire hand length Dh of the hand 72. To be specific, the reduction in the entire link length DL can be realized more easily than the reduction in the entire hand length Dh. By reducing the entire link length DL, the conveying chamber size Dx is reduced, and therefore, the size of the casing 8 in the first direction X is reduced. Thus, the casing 8 can be reduced in size.

When the entire hand length Dh is more than the conveying chamber size Dx (or the effective conveying chamber size Dx'), a posture of the hand 72 cannot become such a posture that the hand longitudinal direction L and the first direction X are parallel to each other in the conveying chamber 80. A side toward which the hand 72 faces in the second direction Y cannot be changed without becoming this posture once. The following will explain the substrate conveying robot 7 according to each of Embodiments 1 and 2 in which: the entire hand length Dh is more than the conveying chamber size Dx (or the effective conveying chamber size Dx'); and the posture of the hand 72 can become such a posture that the hand longitudinal direction L and the first direction X are parallel to each other.

Embodiment 1

The substrate conveying robot 7 according to Embodiment 1 controls the arm 71 such that: when the entire hand 72 is positioned in the conveying chamber 80, the hand longitudinal direction L of the hand 72 is inclined relative to the first direction X; and when the tip end portion of the hand 72 enters through the opening (the front opening 86 or the rear opening 87), the hand longitudinal direction L is parallel to the first direction X.

Figure 5:
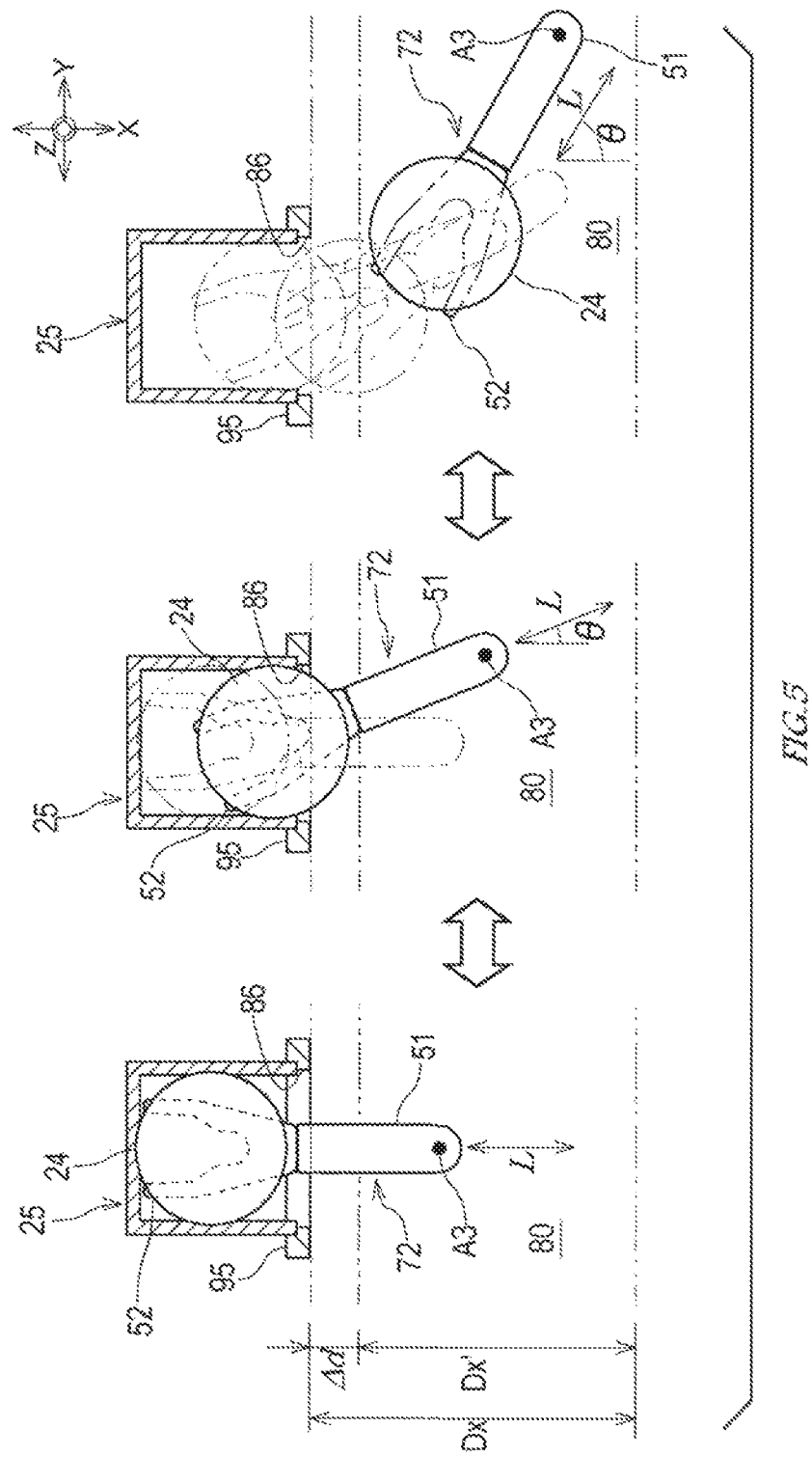
FIG. 5 is a diagram for explaining a case where a robot hand of the substrate conveying robot according to Embodiment 1 enters into or gets out from a conveying chamber through a front opening.

FIG. 5 is a diagram for explaining a case where the robot hand 72 of the substrate conveying robot 7 according to Embodiment 1 enters into or gets out from the conveying chamber 80 through the front opening 86. The following will explain the operations of the substrate conveying robot 7 while focusing on the hand 72. Although not explained, the movement and posture change of the hand 72 are achieved by the operation of the arm 71 controlled by the controller 74.

As shown by a left portion in FIG. 5, when a part of the hand 72 is positioned outside the conveying chamber 80 through the front opening 86, the posture of the hand 72 can become such a posture that the hand longitudinal direction L and the first direction X are parallel to each other. The hand 72 in such a posture that the hand longitudinal direction L and the first direction X are parallel to each other can enter deep into the substrate carrier 25. The substrate carrier 25 opens in a direction parallel to the first direction X. In the substrate carrier 25, the substrate 24 needs to be moved in the direction parallel to the first direction X.

When causing the substrate 24 to move into the conveying chamber 80 through the front opening 86, as shown by a middle portion in FIG. 5, the hand 72 is rotated around a center of the substrate 24 toward one side in the second direction Y while causing the hand 72 to move rearward in the direction parallel to the first direction X until the entire substrate 24 is moved into the conveying chamber 80. The hand 72 may be moved rearward in the direction parallel to the first direction X after the hand 72 is rotated around the center of the substrate 24 toward one side in the second direction Y.

By the rotation of the hand 72, an inclination θ of the hand longitudinal direction L relative to the first direction X increases. As above, in a state where a part of the hand 72 is positioned outside the conveying chamber 80 through the front opening 86, the posture of the hand 72 is changed such that the hand longitudinal direction L is inclined relative to the first direction X. Thus, the size of the hand 72 including the substrate 24 in the first direction X is made less than the conveying chamber size Dx (more preferably, the effective conveying chamber size Dx').

When causing the hand 72 holding the substrate 24 to move in the conveying chamber 80, as shown by a right portion in FIG. 5, the hand longitudinal direction L is inclined relative to the first direction X, and the size of the hand 72 including the substrate 24 in the first direction X is less than the effective conveying chamber size Dx'.

When causing the substrate 24 to move to an outside of the conveying chamber 80 through the front opening 86, as shown by the middle portion in FIG. 5, a tip of the hand 72 is moved to the outside of the conveying chamber 80 through the front opening 86 while maintaining such a posture of the hand 72 that the hand longitudinal direction L is inclined relative to the first direction X. Then, while causing the substrate 24 to move forward in the direction parallel to the first direction X, the hand 72 is rotated around the center of the substrate 24 toward one side in the second direction Y such that the hand longitudinal direction L becomes parallel to the first direction X.

As explained above, according to the substrate conveying robot 7 of Embodiment 1, when the entire hand 72 is positioned in the conveying chamber 80, the posture of the hand 72 is set to such a posture that the hand longitudinal direction L is inclined relative to the first direction X. As a result, the size of the hand 72 including the substrate 24 in the first direction X becomes less than the effective conveying chamber size Dx'. Then, according to the substrate conveying robot 7 of Embodiment 1, when the tip of the hand 72 is positioned outside the conveying chamber 80 through the front opening 86, the posture of the hand 72 can be set to such a posture that the hand longitudinal direction L is parallel to the first direction X. When causing the hand 72 to move again into the conveying chamber 80 after the posture of the hand 72 is set to such a posture that the hand longitudinal direction L is parallel to the first direction X, a direction of the inclination θ of the hand longitudinal direction L relative to the first direction X is reversed. With this, the side toward which the hand 72 faces in the second direction Y can be changed. The foregoing has explained the movement of the hand 72 when the hand 72 is holding the substrate 24. The movement of the hand 72 when the hand 72 is not holding the substrate 24 is the same as above. Further, the foregoing has explained a case where the tip of the hand 72 is moved to the outside of the conveying chamber 80 through the front opening 86. The movement of the hand 72 when the tip of the hand 72 is moved to the outside of the conveying chamber 80 through the rear opening 87 is the same as above.

Embodiment 2

Figure 6:
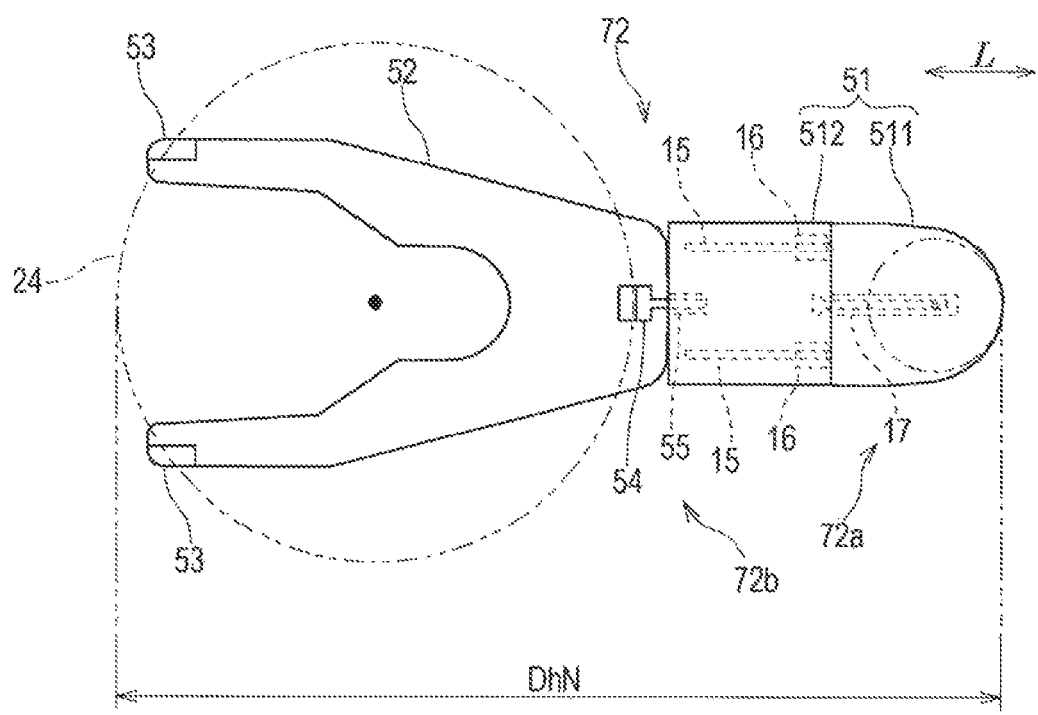
FIG. 6 is a plan view of the robot hand of the substrate conveying robot according to Embodiment 2.
Figure 7:
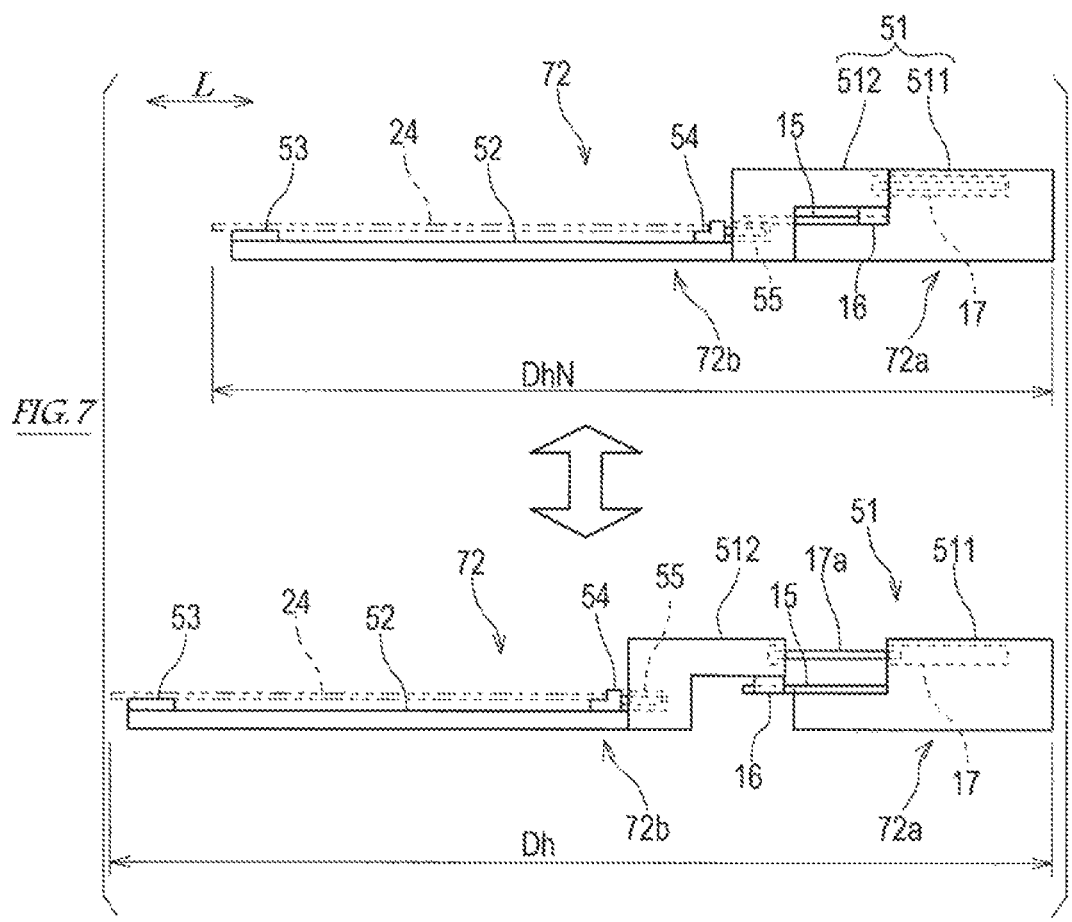
FIG. 7 is a side view of the robot hand shown in FIG. 6.
Figure 8:
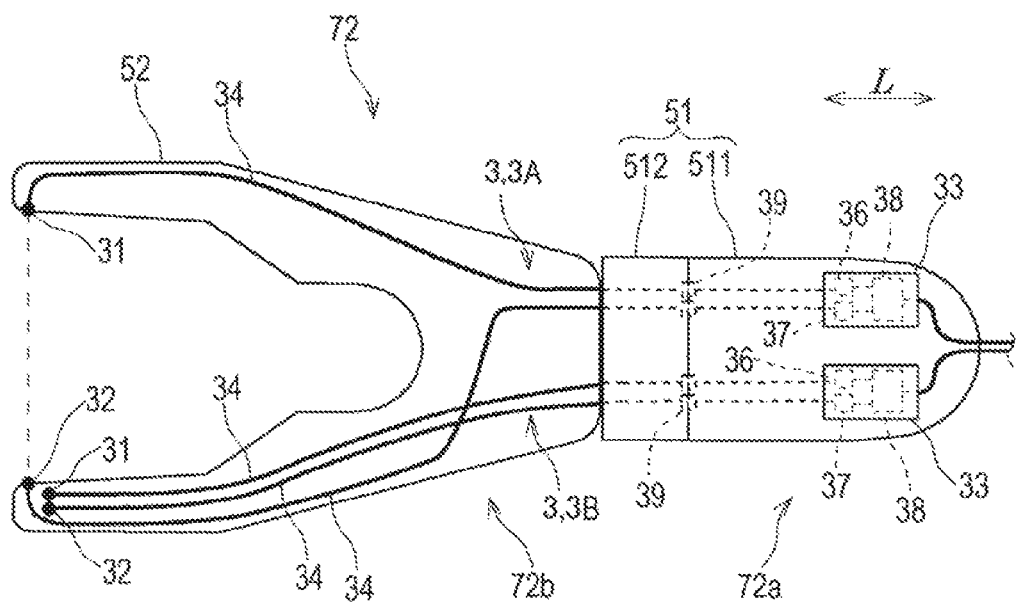
FIG. 8 is a bottom view of the robot hand shown in FIG. 6.
Figure 9:
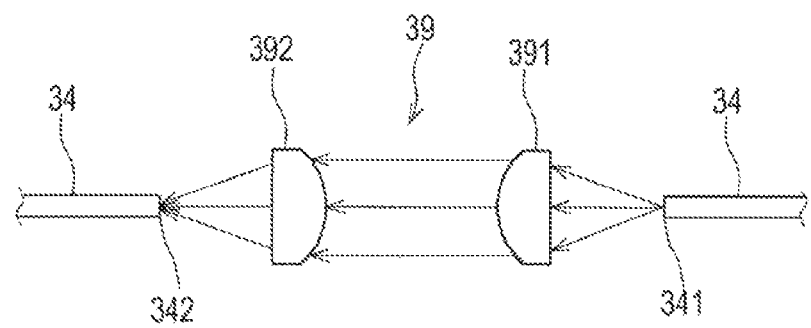
FIG. 9 is a conceptual diagram of optical signal transmission by a lens unit.

FIG. 6 is a plan view of the hand 72 of the substrate conveying robot 7 according to Embodiment 2. FIG. 7 is a side view of the hand 72 shown in FIG. 6. FIG. 8 is a bottom view of the hand 72 shown in FIG. 6. FIG. 9 is a conceptual diagram of optical signal transmission by a lens unit 39. As shown in FIGS. 6 to 9, the hand 72 of the substrate conveying robot 7 according to Embodiment 2 includes: a reference portion 72a coupled to the wrist portion of the arm 71; a movable portion 72b coupled to the reference portion 72a so as to be displaceable relative to the reference portion 72a; and a movement mechanism configured to displace the movable portion 72b relative to the reference portion 72a. With this configuration, by the expansion and contraction of the hand 72 in the hand longitudinal direction L, the posture of the hand 72 can become such a posture that the hand longitudinal direction L and the first direction X are parallel to each other.

As shown by an upper portion in FIG. 7, according to the hand 72 in a steady state, the reference portion 72a and the movable portion 72b are close to each other in the hand longitudinal direction L. A size of the steady-state hand 72 including the substrate 24 in the hand longitudinal direction L is referred to as a "natural hand length DhN". The natural hand length DhN is less than the conveying chamber size Dx, and preferably less than the effective conveying chamber size Dx'.

As shown by a lower portion in FIG. 7, according to the hand 72 in an expanded state, the reference portion 72a and the movable portion 72b are separated from each other in the hand longitudinal direction L. A size of the expanded-state hand 72 including the substrate 24 in the hand longitudinal direction L is referred to as the "entire hand length Dh". The entire hand length Dh is not less than the effective conveying chamber size Dx', and preferably more than the conveying chamber size Dx.

According to the hand 72 of the present embodiment, the hand base portion 51 is constituted by: a first member 511 coupled to the wrist portion of the arm 71; and a second member 512 coupled to the blade 52. The reference portion 72a of the hand 72 is constituted by the first member 511 of the hand base portion 51, and the movable portion 72b of the hand 72 is constituted by the second member 512 of the hand base portion 51 and the blade 52.

The first member 511 and second member 512 of the hand base portion 51 are coupled to each other by a linear movement mechanism such that the second member 512 is displaceable relative to the first member 511 in the hand longitudinal direction L. For example, the linear movement mechanism is constituted by: a rail 15 extending in the hand longitudinal direction L; and a slider 16 configured to travel on the rail 15. In the present embodiment, the rail 15 is provided at the first member 511, and the slider 16 is provided at the second member 512. Further, an actuator 17 configured to displace the second member 512 relative to the first member 511 is provided at the first member 511. For example, the actuator 17 is an air cylinder provided at the first member 511, and a cylinder rod 17a configured to be reciprocated by the air cylinder is coupled to the second member 512. However, the actuator 17 is not limited to the air cylinder, and the other mechanical element, such as a hydraulic cylinder, an electric motor, or a hydraulic motor, having a function similar to a function of the air cylinder may be used as the actuator 17.

As shown in FIG. 8, the hand 72 is provided with at least one optical sensor 3 configured to detect the substrate 24, obstacles, and the like. The hand 72 according to the present embodiment includes two optical sensors 3A and 3B. When it is unnecessary to distinguish between these two optical sensors 3A and 3B, the term "optical sensor 3 (without an alphabetical index)" is used. The optical sensor 3A that is one of two optical sensors 3 is a transmission optical sensor in which: a light projecting portion 31 is provided at one of two tip end portions of the blade 52 of the hand 72; and a light receiving portion 32 is provided at the other tip end portion of the blade 52 of the hand 72. The optical sensor 3B that is the other of two optical sensors 3 is a reflection optical sensor in which the light projecting portion 31 and the light receiving portion 32 are provided at one of two tip end portions of the blade 52 of the hand 72. In the substrate conveying robot 7 according to the present invention, the hand 72 is only required to include at least one optical sensor 3 regardless of the type of the sensor.

Components constituting the optical sensor 3A and components constituting the optical sensor 3B are substantially the same as each other. The optical sensor 3 according to the present embodiment includes: the light projecting portion 31 and light receiving portion 32 provided at the movable portion 72b of the hand 72; an amplifier unit 33 provided at the reference portion 72a of the hand 72; and an optical fiber 34 connecting the light projecting portion 31 and the amplifier unit 33 and another optical fiber 34 connecting the light receiving portion 32 and the amplifier unit 33. The amplifier unit 33 integrally includes a light emitting element 36, a light receiving element 37, and a control board 38. The control board 38 includes an output circuit and an amplifier. The amplifier unit 33 is connected to the controller 74 through a cable (not shown) wired along the arm 71.

Each of the optical fiber 34 connecting the light projecting portion 31 and the light emitting element 36 and the optical fiber 34 connecting the light receiving portion 32 and the light receiving element 37 is divided at a boundary between the reference portion 72a and movable portion 72b of the hand 72. As shown in FIG. 9, at least one of these two optical fibers 34 includes a pair of divided end portions that are: a first divided end portion 341 provided at the reference portion 72a; and a second divided end portion 342 provided at the movable portion 72b and configured to be displaced integrally with the movable portion 72b. The lens unit 39 is provided between the first divided end portion 341 and the second divided end portion 342 so as to optically connect the first divided end portion 341 and the second divided end portion 342.

As shown in FIG. 9, for example, the lens unit 39 includes: a collimate lens 391 provided at a light emitting side corresponding to one of the first divided end portion 341 and the second divided end portion 342; and a condensing lens 392 provided at a light receiving side corresponding to the other of the first divided end portion 341 and the second divided end portion 342. To be specific, light incident on the collimate lens 391 from a light-projecting-side divided end portion (in FIG. 9, the first divided end portion 341) of the optical fiber 34 is collimated by the collimate lens 391 to become parallel light flux, and the parallel light flux is incident on the condensing lens 392. The parallel light flux incident on the condensing lens 392 is coupled by the condensing lens 392 to a light-receiving-side divided end portion (in FIG. 9, the second divided end portion 342) of the optical fiber 34 provided on a focal surface of the condensing lens 392. The lens unit 39 is constituted by, for example, a combination of lenses of at least one type among a ball lens, a semispherical lens, a drum lens, and a half drum lens. Thus, an optical signal from the light emitting element 36 is transmitted to the light projecting portion 31, and the optical signal received by the light receiving portion 32 is transmitted to the light receiving element 37.

Figure 10:
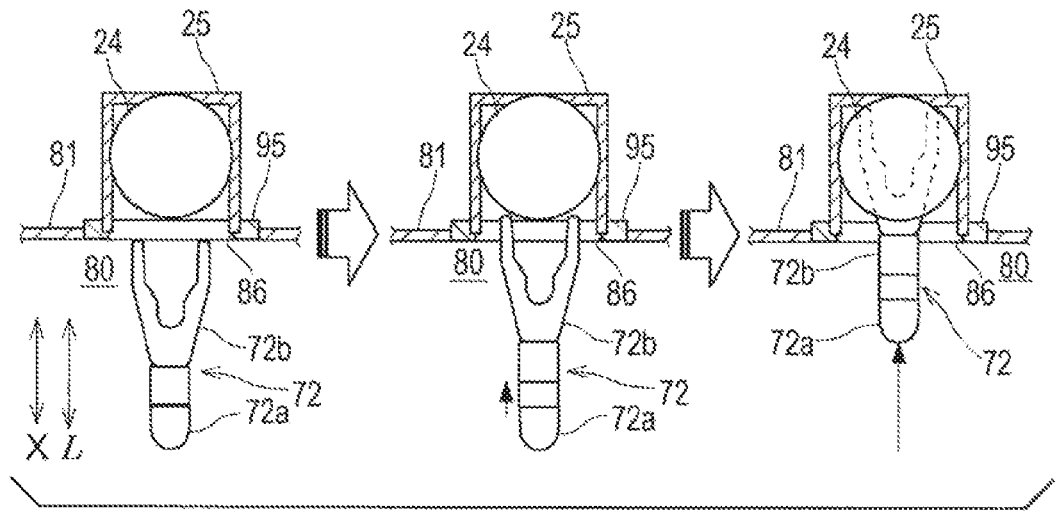
FIG. 10 is a diagram for explaining a case where the robot hand of the substrate conveying robot according to Embodiment 2 enters into or gets out from the conveying chamber through the front opening.

FIG. 10 is a diagram for explaining a case where the robot hand 72 of the substrate conveying robot 7 according to Embodiment 2 enters into or gets out from the conveying chamber 80 through the front opening 86. The following will explain the operations of the substrate conveying robot 7 while focusing on the hand 72. Although not explained, the movement and posture change of the hand 72 are achieved by the operation of the arm 71 controlled by the controller 74, and the expansion and contraction of the hand 72 are achieved by the operation of the actuator 17 controlled by the controller 74.

As shown by a left portion in FIG. 10, when taking out the substrate 24 from the substrate carrier 25, the hand 72 in the steady state moves in the conveying chamber 80 to the front of the front opening 86 communicating with the substrate carrier 25. At this time, the posture of the hand 72 is such a posture that the hand longitudinal direction L is parallel to the first direction X.

Next, as shown by a middle portion in FIG. 10, the hand 72 is expanded in the hand longitudinal direction L to become the expanded state. Especially in a case where the air cylinder is adopted as the actuator 17, a displacement speed of the movable portion 72b may change or become higher than a set speed by source pressure. Therefore, it is desirable that the hand 72 be inserted into the substrate carrier 25 after the hand 72 becomes the expanded state. A part of the hand 72 in the expanded state is positioned outside the conveying chamber 80 through the front opening 86.

Next, as shown by a right portion in FIG. 10, the hand 72 moves forward through the front opening 86 to a pickup position of the substrate 24 in the substrate carrier 25. The hand 72 at the pickup position receives the substrate 24 from the substrate carrier 25 and holds the substrate 24.

The foregoing has explained the hand 72 when the hand 72 takes out the substrate 24 from the substrate carrier 25. The movement of the hand 72 when the hand 72 stores the substrate 24 in the substrate carrier 25 is opposite to the above movement. Further, the foregoing has explained a case where the tip of the hand 72 moves to the outside of the conveying chamber 80 through the front opening 86. The movement of the hand 72 when the tip of the hand 72 moves to the outside of the conveying chamber 80 through the rear opening 87 is the same as the above movement.

As explained above, the hand 72 of the substrate conveying robot 7 according to the present embodiment includes: the reference portion 72a coupled to the wrist portion of the arm 71; the movable portion 72b coupled to the reference portion 72a so as to be displaceable relative to the reference portion 72a; the movement mechanism configured to displace the movable portion 72b relative to the reference portion 72a; and at least one optical sensor 3. Specifically, the hand 72 includes: the hand base portion 51 coupled to the wrist portion of the arm 71; and the blade 52 coupled to the hand base portion 51 and configured to hold the substrate 24. The reference portion 72a of the hand base portion 51 is constituted by a part of the hand base portion 51, and the movable portion 72b is constituted by a remaining part of the hand base portion 51 and the blade 52.

The hand 72 configured as above is controlled by the controller 74 so as to become the steady state when the entire hand 72 is positioned in the conveying chamber 80 and become the expanded state when the tip end portion of the hand 72 is positioned outside the conveying chamber 80 (for example, in the substrate carrier 25 or the treatment chamber 22). According to the hand 72 capable of expanding and contracting as above, the entire hand length Dh that is not less than the conveying chamber size Dx (or the effective conveying chamber size Dx') can be easily realized. Even if the entire hand length Dh is more than conveying chamber size Dx, the posture of the hand 72 can become such a posture that the hand longitudinal direction L is parallel to the first direction X.

In the hand 72, a coupling portion between the reference portion 72a and movable portion 72b of the hand 72 is provided at the hand base portion 51. Therefore, an influence on the substrate 24 held by the hand 72 when the movable portion 72b is displaced relative to the reference portion 72a is reduced.

Generally, the optical fiber 34 is lower in bending resistance and twisting resistance than an electric cable frequently used in industrial robots. When the optical fiber 34 repeatedly bends and extends, a bending loss of light changes. The hand 72 of the substrate conveying robot 7 according to Embodiment 2 includes at least one optical sensor 3A or 3B including: the light projecting portion 31 and light receiving portion 32 provided at the movable portion 72b; the amplifier unit 33 provided at the reference portion 72a; the optical fiber 34 connecting the light projecting portion 31 and the amplifier unit 33 and the optical fiber 34 connecting the light receiving portion 32 and the amplifier unit 33; and the lens unit 39. At least one of the optical fibers 34 includes a pair of divided end portions that are the first divided end portion 341 provided at the reference portion 72a and the second divided end portion 342 provided at the movable portion 72b, and the first divided end portion 341 and the second divided end portion 342 are optically coupled to each other by the lens unit 39.

Since the first divided end portion 341 and second divided end portion 342 of the optical fiber 34 are coupled to each other by the lens unit 39, the optical fiber 34 does not expand or contract by the expansion or contraction of the hand 72. Thus, the deterioration and bending loss of the optical fiber 34 are expected to be suppressed, the deterioration and bending loss being caused by repeatedly expanding, contracting, and bending the optical fiber 34.

Modification Example 1

Figure 11:
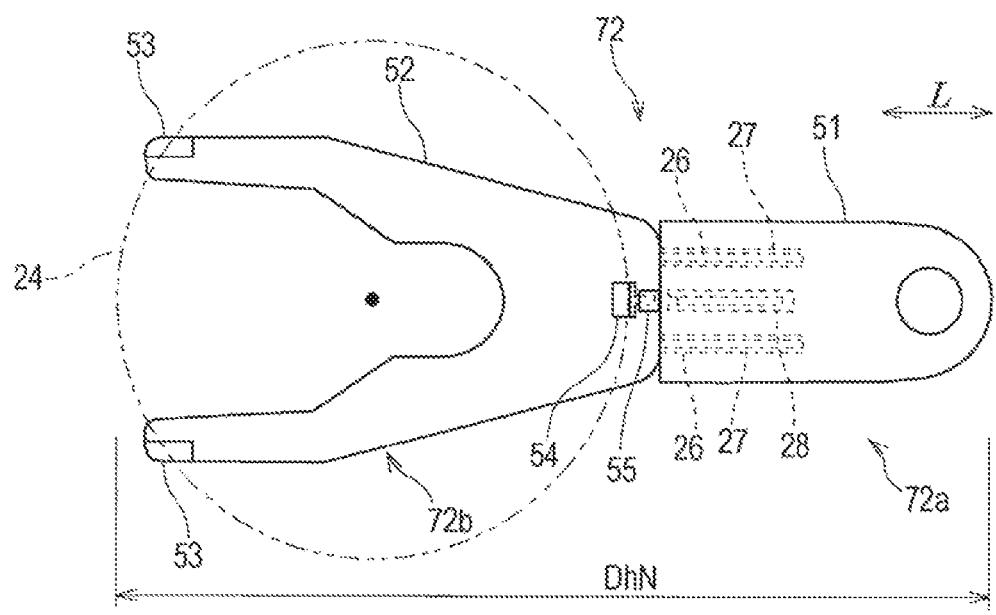
FIG. 11 is a plan view of the robot hand of the substrate conveying robot according to Modification Example 1 of Embodiment 2.
Figure 12:
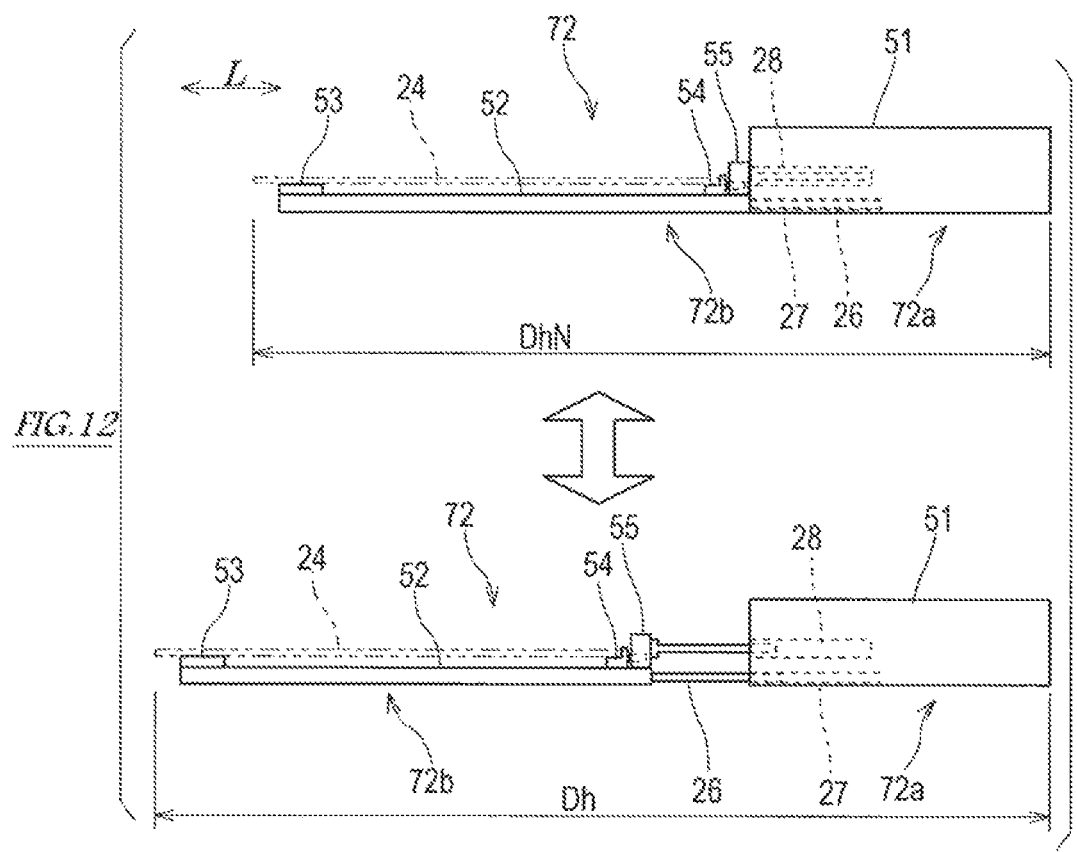
FIG. 12 is a side view of the robot hand shown in FIG. 11.
Figure 13:
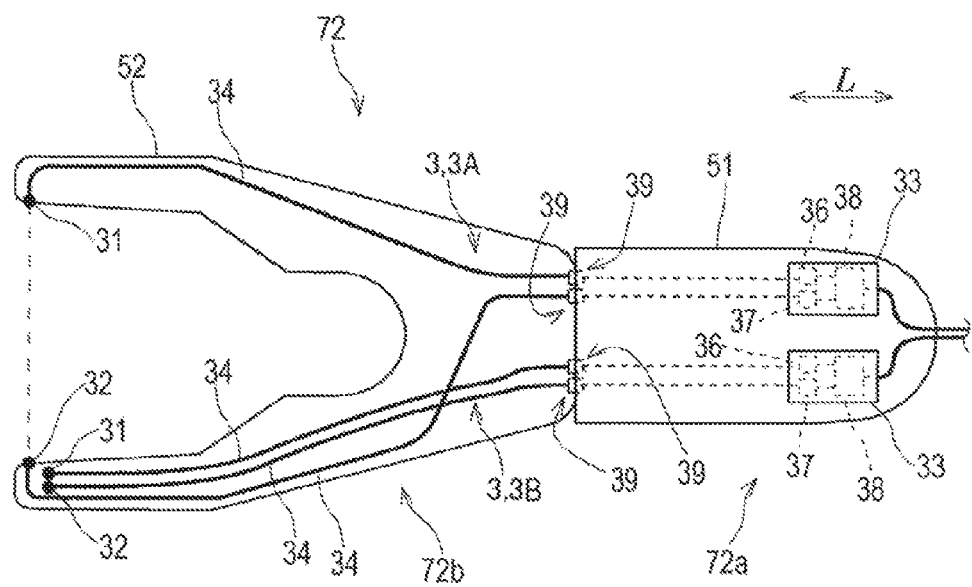
FIG. 13 is a bottom view of the robot hand shown in FIG. 11.

Next, the substrate conveying robot 7 according to Modification Example 1 of Embodiment 2 will be explained. FIG. 11 is a plan view of the hand 72 of the substrate conveying robot 7 according to Modification Example 1 of Embodiment 2. FIG. 12 is a side view of the hand 72 shown in FIG. 11. FIG. 13 is a bottom view of the hand 72 shown in FIG. 11. The substrate conveying robot 7 according to Modification Example 1 of Embodiment 2 is substantially the same in configuration as the substrate conveying robot 7 according to Embodiment 2 except for the hand 72. In Modification Example 1 and the drawings, the same reference signs are used or the same or corresponding members as in Embodiment 2, and a repetition of the same explanation is avoided in some cases.

As shown in FIGS. 11 and 12, in the hand 72 of the substrate conveying robot 7 according to Modification Example 1, the hand base portion 51 is configured as the reference portion 72a, and the blade 52 is configured as the movable portion 72b. The hand 72 is provided with a linear movement mechanism configured to displace the blade 52 in the hand longitudinal direction L toward and away from the hand base portion 51. In Modification Example 1, the linear movement mechanism is constituted by: a sliding shaft 26 extending in the hand longitudinal direction L; a bore 27 into which the sliding shaft 26 is inserted and which extends in the hand longitudinal direction L; and an actuator 28 configured to displace the sliding shaft 26 relative to the bore 27. The sliding shaft 26 is provided at the blade 52, and the bore 27 is provided at the hand base portion 51.

As shown in FIG. 13, as with the above embodiment, at least one optical sensor 3 is provided on a bottom surface of the hand 72. The light projecting portion 31 and light receiving portion 32 of the optical sensor 3 are provided at the blade 52, and the amplifier unit 33 is provided at the hand base portion 51. The light projecting portion 31 and the light emitting element 36 of the amplifier unit 33 are coupled to each other by the optical fiber 34, and the light receiving portion 32 and the light receiving element 37 of the amplifier unit 33 are coupled to each other by the different optical fiber 34. At least one of the optical fibers 34 is divided at a position between the hand base portion 51 and the blade 52 and includes the first divided end portion 341 and the second divided end portion 342. The first divided end portion 341 and the second divided end portion 342 are optically coupled to each other by the lens unit 39.

Modification Example 2

Next, the substrate conveying robot 7 according to Modification Example 2 of Embodiment 2 will be explained. The substrate conveying robot 7 according to Modification Example 2 of Embodiment 2 is different from the substrate conveying robot 7 according to Embodiment 2 regarding control operations of the controller 74 when the hand 72 enters into or gets out from the conveying chamber 80 through the front opening 86 or the rear opening 87. Since a physical configuration of the substrate conveying robot 7 according to Modification Example 2 is substantially the same as a physical configuration of the substrate conveying robot 7 according to Embodiment 2, an explanation regarding the specific configuration of the substrate conveying robot 7 according to Modification Example 2 is omitted.

Figure 14:
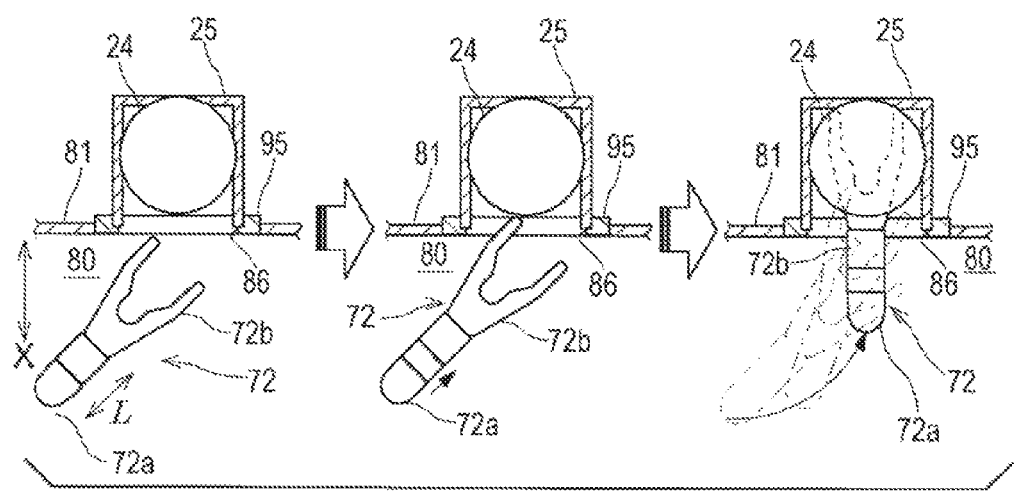
FIG. 14 is a diagram for explaining a case where the robot hand of the substrate conveying robot according to Modification Example 2 of Embodiment 2 enters into or gets out from the conveying chamber through the front opening.

FIG. 14 is a diagram for explaining a case where the hand 72 of the substrate conveying robot 7 according to Modification Example 2 of Embodiment 2 enters into or gets out from the conveying chamber 80 through the front opening 86. The following will explain the operations of the substrate conveying robot 7 while focusing on the hand 72. Although not explained, the movement and posture change of the hand 72 are achieved by the operation of the arm 71 controlled by the controller 74, and the expansion and contraction of the hand 72 are achieved by the operation of the actuator 17 controlled by the controller 74.

As shown by a left portion in FIG. 14, when taking out the substrate 24 from the substrate carrier 25, the hand 72 in the steady state moves in the conveying chamber 80 to the front of the front opening 86 communicating with the substrate carrier 25 storing the substrate 24. At this time, the tip end of the hand 72 is positioned in front of the front opening 86, and the hand longitudinal direction L is not parallel to the first direction X but is inclined relative to the first direction X toward the horizontal direction.

Next, as shown by a middle portion in FIG. 14, the hand 72 is expanded in the hand longitudinal direction L to become the expanded state. A part of the hand 72 in the expanded state is positioned outside the conveying chamber 80 through the front opening 86.

Next, as shown in a right portion in FIG. 14, the hand 72 moves forward through the front opening 86 to the pickup position of the substrate 24 in the substrate carrier 25 so as to draw an arc in a plan view. The hand 72 at the pickup position receives the substrate 24 from the substrate carrier 25 and holds the substrate 24.

As described above, the hand longitudinal direction L of the hand 72 positioned in front of the front opening 86 is inclined relative to the first direction X toward the horizontal direction. Therefore, the distance of movement of the hand 72 into the substrate carrier 25 when the hand 72 in front of the front opening 86 changes from the steady state to the expanded state can be reduced. Thus, it is possible to reduce the possibility of the contact of the hand 72 with the substrate 24, the contact being caused due to vibrations or the like generated by the expansion of the hand 72.

Modification Example 3

Next, the substrate conveying robot 7 according to Modification Example 3 of Embodiment 2 will be explained. Since a physical configuration of the substrate conveying robot 7 according to Modification Example 3 of Embodiment 2 is substantially the same as a physical configuration of the substrate conveying robot 7 according to Embodiment 2, an explanation regarding the specific configuration of the substrate conveying robot 7 according to Modification Example 3 is omitted.

Figure 15:
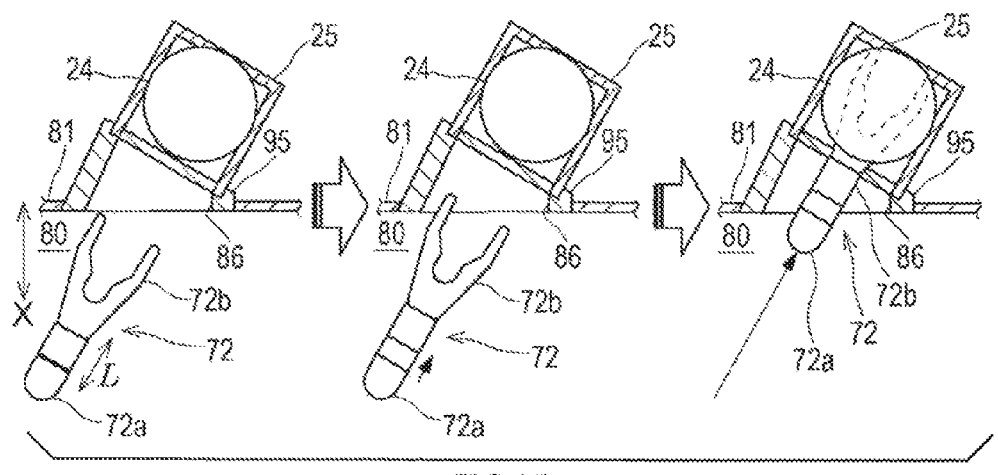
FIG. 15 is a diagram for explaining a case where the robot hand of the substrate conveying robot according to Modification Example 3 of Embodiment 2 enters into or gets out from the conveying chamber through the front opening.

FIG. 15 is a diagram for explaining a case where the hand 72 of the substrate conveying robot 7 according to Modification Example 2 of Embodiment 3 enters into or gets out from the conveying chamber 80 through the front opening 86. As shown in FIG. 15, in the substrate transfer device 1 accommodating the substrate conveying robot 7 according to Modification Example 3, an opening direction of the front opening 86 is inclined relative to the first direction X toward the horizontal direction. Therefore, a distance from an opening portion of the container main body 60 of the substrate carrier 25 to the front opening 86 of the front wall 81 of the casing 8 is longer than that of the substrate conveying robot 7 according to Embodiment 2.

The following will explain the operations of the substrate conveying robot 7 while focusing on the hand 72. Although not explained, the operation of the hand 72 is controlled by the controller 74. Further, the movement of the hand 72 is achieved by the operation of the arm 71 controlled by the controller 74, and the expansion and contraction of the hand 72 are achieved by the operation of the actuator 17 controlled by the controller 74.

As shown by a left portion in FIG. 15, when taking out the substrate 24 from the substrate carrier 25, the hand 72 in the steady state moves in the conveying chamber 80 to the front of the front opening 86 communicating with the substrate carrier 25 storing the substrate 24. At this time, the tip end of the hand 72 is positioned in front of the front opening 86, and the hand longitudinal direction L is not substantially parallel to the first direction X but is inclined relative to the first direction X toward the horizontal direction.

Next, as shown by a middle portion in FIG. 15, the hand 72 is expanded in the hand longitudinal direction L to become the expanded state. A part of the hand 72 in the expanded state is positioned outside the conveying chamber 80 through the front opening 86.

Next, as shown by a right portion in FIG. 15, the hand 72 moves forward through the front opening 86 to the pickup position of the substrate 24 in the substrate carrier 25. At this time, a movement trajectory of the hand 72 is inclined relative to the first direction X toward the horizontal direction. The hand 72 at the pickup position receives the substrate 24 from the substrate carrier 25 and holds the substrate 24.

As described above, the hand longitudinal direction L of the hand 72 positioned in front of the front opening 86 is inclined relative to the first direction X toward the horizontal direction. Therefore, when the hand 72 in front of the front opening 86 changes from the steady state to the expanded state, the tip end of the hand 72 stops at a position between the opening of the substrate carrier 25 and the front opening 86 of the casing 8, so that the tip end of the hand 72 can be prevented from entering into the substrate carrier 25. Thus, it is possible to reduce the possibility of the contact of the hand 72 with the substrate 24, the contact being caused due to vibrations or the like generated by the expansion of the hand 72.

Modification Example 4

Next, the substrate conveying robot 7 according to Modification Example 4 of Embodiment 2 will be explained. The substrate conveying robot 7 according to Modification Example 4 of Embodiment 2 is different from the substrate conveying robot 7 according to Embodiment 2 regarding control operations of the controller 74 when the hand 72 enters into or gets out from the conveying chamber 80 through the front opening 86 or the rear opening 87. Since a physical configuration of the substrate conveying robot 7 according to Modification Example 4 is substantially the same as a physical configuration of the substrate conveying robot 7 according to Embodiment 2, an explanation regarding the specific configuration of the substrate conveying robot 7 according to Modification Example 4 is omitted.

Figure 16:
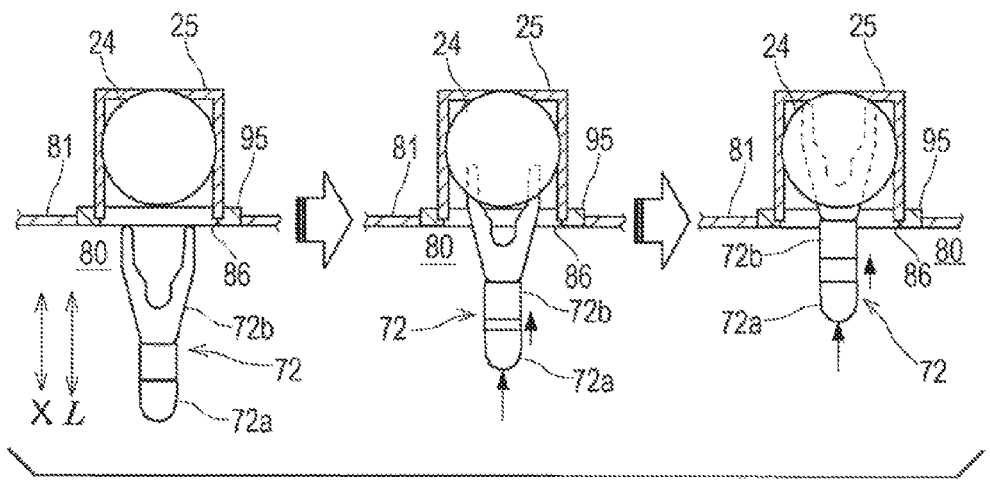
FIG. 16 is a diagram for explaining a case where the robot hand of the substrate conveying robot according to Modification Example 4 of Embodiment 2 enters into or gets out from the conveying chamber through the front opening.

FIG. 16 is a diagram for explaining a case where the hand 72 of the substrate conveying robot 7 according to Modification Example 4 of Embodiment 2 enters into or gets out from the conveying chamber 80 through the front opening 86. The following will explain the operations of the substrate conveying robot 7 while focusing on the hand 72. Although not explained, the movement and posture change of the hand 72 are achieved by the operation of the arm 71 controlled by the controller 74, and the expansion and contraction of the hand 72 are achieved by the operation of the actuator 17 controlled by the controller 74.

As shown by a left portion in FIG. 16, when taking out the substrate 24 from the substrate carrier 25, the hand 72 in the steady state moves in the conveying chamber 80 to the front of the front opening 86 communicating with the substrate carrier 25 storing the substrate 24. At this time, the tip end of the hand 72 is positioned in front of the front opening 86, and the hand longitudinal direction L is not parallel to the first direction X but is inclined relative to the first direction X toward the horizontal direction.

Next, as shown by a middle portion in FIG. 16, the hand 72 is moved forward toward the substrate carrier 25, and at the same time, the hand 72 is changed from the steady state to the expanded state. A part of the hand 72 in the expanded state is positioned outside the conveying chamber 80 through the front opening 86.

As above, the movement and expansion of the hand 72 are simultaneously performed, and as shown by a right portion in FIG. 16, the hand 72 moves to the pickup position of the substrate 24 in the substrate carrier 25. The hand 72 at the pickup position receives the substrate 24 from the substrate carrier 25 and holds the substrate 24.

The foregoing has explained the hand 72 when the hand 72 takes out the substrate 24 from the substrate carrier 25. The movement of the hand 72 when the hand 72 stores the substrate 24 in the substrate carrier 25 is opposite to the above movement. Further, the foregoing has explained a case where the tip of the hand 72 moves to the outside of the conveying chamber 80 through the front opening 86. The movement of the hand 72 when the tip of the hand 72 moves to the outside of the conveying chamber 80 through the rear opening 87 is the same as the above movement.

As above, according to the substrate conveying robot 7 of Modification Example 4, when the hand 72 enters into or gets out from the conveying chamber 80 through the front opening 86 or the rear opening 87, the hand 72 moves while changing from the steady state to the expanded state or vice versa. According to the control of the substrate conveying robot 7 of Modification Example 4, a cycle time of the treatment can be made shorter than that of Embodiment 2.

The hand 72 may be controlled such that: a predetermined expansion completion position is set in front of the pickup position for the hand 72 and/or a drop-off position for the hand 72; and the expansion of the hand 72 is completed at or in front of the expansion completion position. With this, it is possible to avoid a case where the hand 72 expands at the pickup position or the drop-off position to interfere with the substrate carrier 25 or a component of the substrate transfer device 1.

In the substrate conveying robot 7 of the substrate treatment facility 100 according to each of Modification Examples 1 to 3, the hand 72 may be controlled to move while changing from the steady state to the expanded state or vice versa.

Modification Example 5

Figure 17:
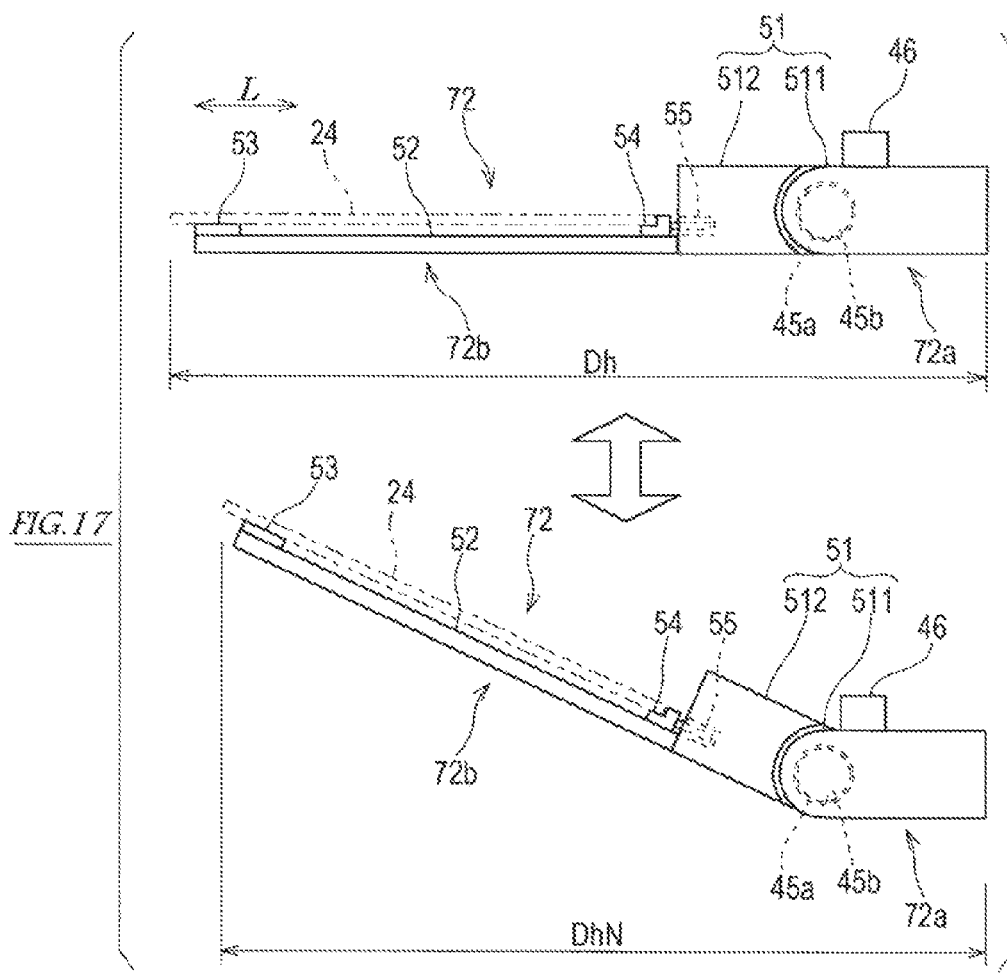
FIG. 17 is a side view of the robot hand of the substrate conveying robot according to Modification Example 5 of Embodiment 2.
Figure 18:
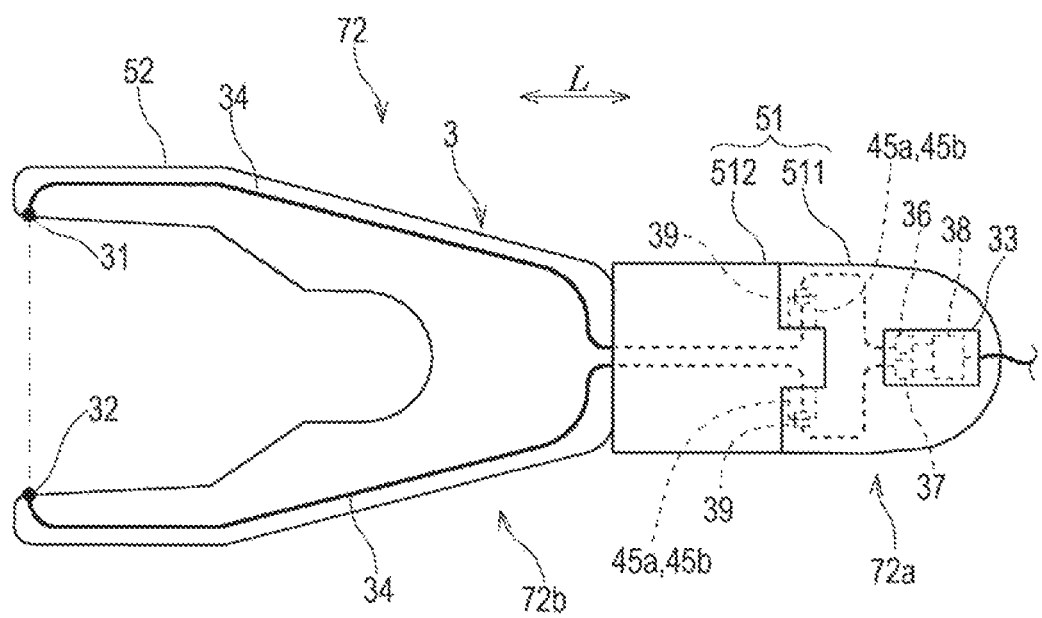
FIG. 18 is a bottom view of the robot hand shown in FIG. 17.

Next, the substrate conveying robot 7 according to Modification Example 5 of Embodiment 2 will be explained. FIG. 17 is a side view of the hand 72 of the substrate conveying robot 7 according to Modification Example 5 of Embodiment 2. FIG. 18 is a rear view of the hand 72 shown in FIG. 17. In the present embodiment and the drawings, the same reference signs are used for the same or corresponding members as in the substrate conveying robot 7 of Embodiment 2, and a repetition of the same explanation is avoided in some cases.

As shown in FIGS. 17 and 18, the hand 72 of the substrate conveying robot 7 according to Modification Example 5 includes: the reference portion 72a coupled to the wrist portion of the arm 71; the movable portion 72b coupled to the reference portion 72a so as to be displaceable relative to the reference portion 72a; a rotational movement mechanism configured to displace the movable portion 72b relative to the reference portion 72a; and at least one optical sensor 3.

The hand 72 includes: the hand base portion 51 coupled to the wrist portion of the arm 71; and the blade 52 coupled to the hand base portion 51. The substrate 24 is placed on the blade 52. The hand base portion 51 is constituted by: the first member 511 coupled to the wrist portion of the arm 71; and the second member 512 coupled to the blade 52. The reference portion 72a of the hand 72 is constituted by the first member 511 of the hand base portion 51, and the movable portion 72b of the hand 72 is constituted by the second member 512 of the hand base portion 51 and the blade 52.

The first member 511 and second member 512 of the hand base portion 51 are coupled to each other by the rotational movement mechanism such that the second member 512 is rotationally displaceable relative to the first member 511 in the upward/downward direction Z (vertical direction). For example, the rotational movement mechanism is constituted by: a rotational support shaft 45a extending in the horizontal direction; a bearing 45b supporting the rotational support shaft 45a; and an actuator 46 configured to cause the second member 512 to rotate relative to the first member 511. In the present embodiment, the rotational support shaft 45a is provided at the second member 512, and the bearing 45b is provided at the first member 511.

The optical sensor 3 includes: the light projecting portion 31 and light receiving portion 32 provided at the movable portion 72b; the amplifier unit 33 provided at the reference portion 72a; the optical fiber 34 connecting the light projecting portion 31 and the amplifier unit 33 and the different optical fiber 34 connecting the light receiving portion 32 and the amplifier unit 33; and the lens unit 39 provided at a portion of at least one of the optical fibers 34. At least one of the optical fibers 34 includes a pair of divided end portions that are the first divided end portion 341 provided at the reference portion 72a and the second divided end portion 342 provided at the movable portion 72b, and the first divided end portion 341 and the second divided end portion 342 are optically coupled to each other by the lens unit 39 (see FIG. 9).

In the present Modification Example, the second divided end portion 342 of the optical fiber 34 is positioned at an end portion of the rotational support shaft 45a, and the first divided end portion 341 of the optical fiber 34 is positioned at a deep portion of a hole of the bearing 45b into which the rotational support shaft 45a is inserted. The lens unit 39 is provided between the end portion of the rotational support shaft 45a and the deep portion of the hole of the bearing 45b. Even when the movable portion 72b of the hand 72 rotates relative to the reference portion 72a in the upward/downward direction Z, a position of a center axis of the rotational support shaft 45a is not displaced relative to the reference portion 72a. Therefore, it is desirable that the lens unit 39 be provided on the center axis of the rotational support shaft 45a.

Since the movable portion 72b rotates relative to the reference portion 72a around the rotational support shaft 45a in the vertical direction, the hand 72 configured as above can change between the expanded state shown by an upper portion in FIG. 17 and the steady state shown by a lower portion in FIG. 17. The natural hand length DhN of the hand 72 in the steady state is shorter than the entire hand length Dh of the hand 72 in the expanded state. The hand 72 is the steady state in the conveying chamber 80, and when the tip of the hand 72 is positioned outside the conveying chamber 80 through the front opening 86 or the rear opening 87, the hand 72 becomes the expanded state. With this, the size of the casing 8 in the first direction X can be reduced.

In the hand 72 configured as above, the divided end portions of the optical fiber 34 are rotated and displaced by the rotation and displacement of the movable portion 72b relative to the reference portion 72a, but this does not cause the twisting, bending, expanding, or contracting of the optical fiber 34. Therefore, the deterioration and bending loss of the optical fiber 34 can be suppressed, the deterioration and bending loss being caused by repeatedly expanding, contracting, and bending the optical fiber 34.

Modification Example 6

Figure 19:
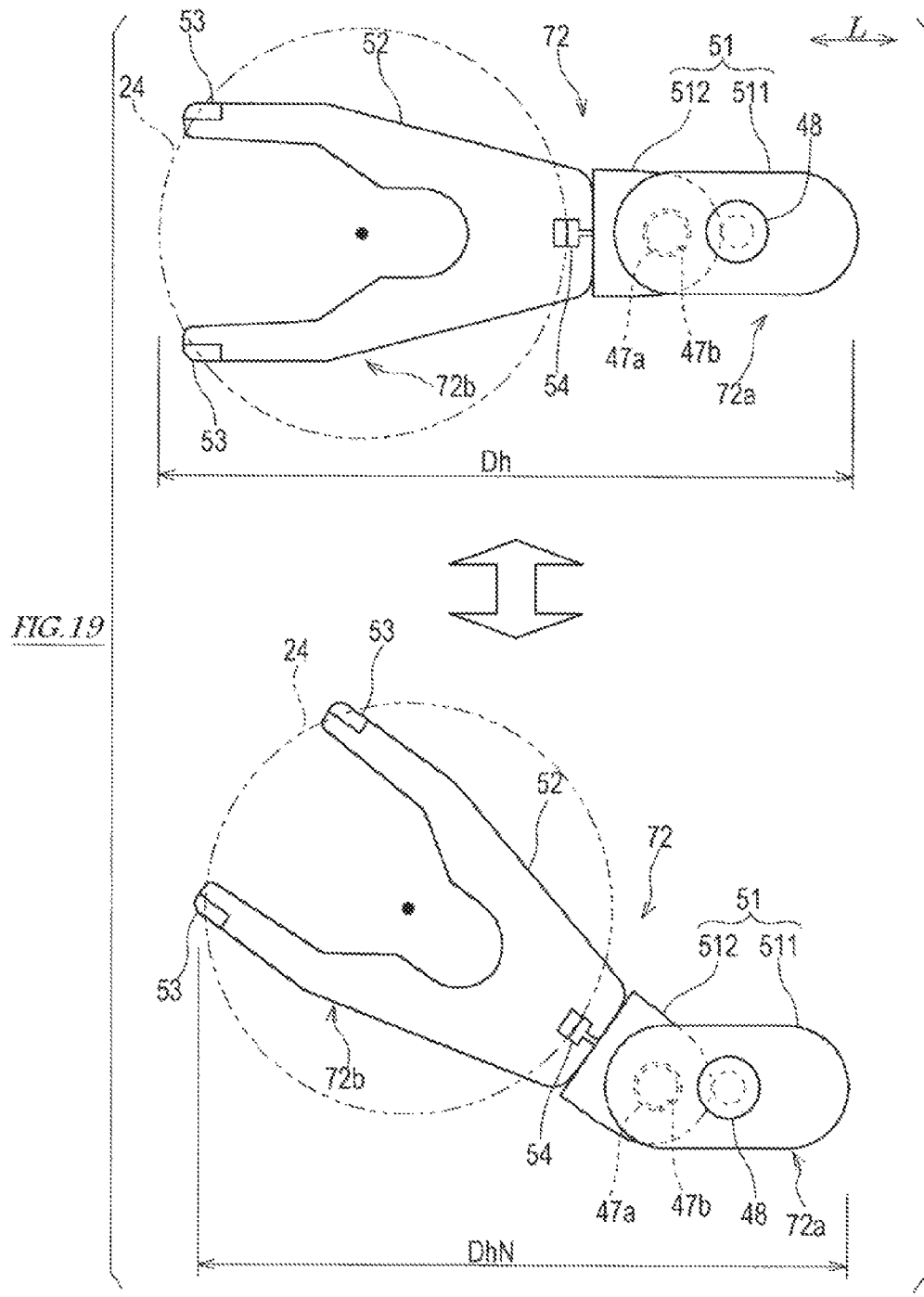
FIG. 19 is a side view of the robot hand of the substrate conveying robot according to Modification Example 6 of Embodiment 2.
Figure 20:
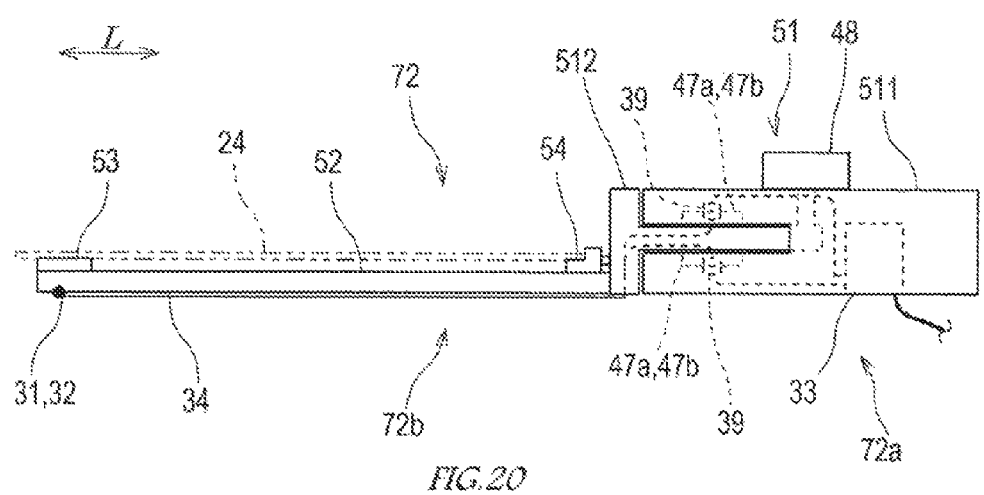
FIG. 20 is a side view of the robot hand shown in FIG. 19.

Next, the substrate conveying robot 7 according to Modification Example 6 of Embodiment 2 will be explained. FIG. 19 is a side view of the hand 72 of the substrate conveying robot 7 according to Modification Example 6 of Embodiment 2. FIG. 20 is a side view of the hand 72 shown in FIG. 19. In the present modification example and the drawings, the same reference signs are used for the same or corresponding members as in the substrate conveying robot 7 of Embodiment 2, and a repetition of the same explanation is avoided in some cases.

As shown in FIGS. 19 and 20, the hand 72 of the substrate conveying robot 7 according to Modification Example 6 includes: the reference portion 72a coupled to the wrist portion of the arm 71; the movable portion 72b coupled to the reference portion 72a so as to be displaceable relative to the reference portion 72a; a rotational movement mechanism configured to displace the movable portion 72b relative to the reference portion 72a; and at least one optical sensor 3.

The hand 72 includes: the hand base portion 51 coupled to the wrist portion of the arm 71; and the blade 52 coupled to the hand base portion 51. The substrate 24 is placed on the blade 52. The hand base portion 51 is constituted by: the first member 511 coupled to the wrist portion of the arm 71; and the second member 512 coupled to the blade 52. The reference portion 72a of the hand 72 is constituted by the first member 511 of the hand base portion 51, and the movable portion 72b of the hand 72 is constituted by the second member 512 of the hand base portion 51 and the blade 52.

The first member 511 and second member 512 of the hand base portion 51 are coupled to each other by the rotational movement mechanism such that the second member 512 is rotationally displaceable relative to the first member 511 in the upward/downward direction Z. For example, the rotational movement mechanism is constituted by: a rotational support shaft 47a extending in the upward/downward direction Z; a bearing 47b supporting the rotational support shaft 47a; and an actuator 48 configured to cause the second member 512 to rotate relative to the first member 511. In the present embodiment, the rotational support shaft 47a is integrally provided at the second member 512, and the bearing 47b is provided at the first member 511.

The optical sensor 3 includes: the light projecting portion 31 and light receiving portion 32 provided at the movable portion 72b; the amplifier unit 33 provided at the reference portion 72a; the optical fiber 34 connecting the light projecting portion 31 and the amplifier unit 33 and the different optical fiber 34 connecting the light receiving portion 32 and the amplifier unit 33; and the lens unit 39 provided at a portion of at least one of the optical fibers 34. At least one of the optical fibers 34 includes a pair of divided end portions that are the first divided end portion 341 provided at the reference portion 72a and the second divided end portion 342 provided at the movable portion 72b, and the first divided end portion 341 and the second divided end portion 342 are optically coupled to each other by the lens unit 39 (see FIG. 9).

In the present Modification Example, the second divided end portion 342 of the optical fiber 34 is positioned at an end portion of the rotational support shaft 47a, and the first divided end portion 341 of the optical fiber 34 is positioned at a deep portion of a hole of the bearing 47b into which the rotational support shaft 47a is inserted. The lens unit 39 is provided between the end portion of the rotational support shaft 47a and the deep portion of the hole of the bearing 47b. Even when the movable portion 72b of the hand 72 rotates relative to the reference portion 72a in the horizontal direction, a position of a center axis of the rotational support shaft 47a is not displaced relative to the reference portion 72a. Therefore, it is desirable that the lens unit 39 be provided on the center axis of the rotational support shaft 47a.

Since the movable portion 72b rotates relative to the reference portion 72a around the rotational support shaft 47a in the horizontal direction, the hand 72 configured as above can change between the expanded state shown by an upper portion in FIG. 18 and the steady state shown by a lower portion in FIG. 18. The natural hand length DhN of the hand 72 in the steady state is shorter than the entire hand length Dh of the hand 72 in the expanded state. The hand 72 is the steady state in the conveying chamber 80, and when the tip of the hand 72 is positioned outside the conveying chamber 80 through the front opening 86 or the rear opening 87, the hand 72 becomes the expanded state. With this, the size of the casing 8 in the first direction X can be reduced.

In the hand 72 configured as above, the divided end portions of the optical fiber 34 are rotated and displaced by the rotation and displacement of the movable portion 72b relative to the reference portion 72a, but this does not cause the twisting, bending, expanding, or contracting of the optical fiber 34. Therefore, the deterioration and bending loss of the optical fiber 34 can be suppressed, the deterioration and bending loss being caused by repeatedly expanding, contracting, and bending the optical fiber 34.

The foregoing has explained a case where in the hand 72 of the substrate conveying robot 7 according to each of Modification Examples 6 and 7, the reference portion 72a is constituted by the first member 511 of the hand base portion 51, and the movable portion 72b is constituted by the second member 512 of the hand base portion 51 and the blade 52. However, as with Modification Example 2, the reference portion 72a may be constituted by the hand base portion 51, and the movable portion 72b may be constituted by the blade 52.

The foregoing has explained preferred embodiments (and modification examples) of the present invention. From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the scope of the present invention.

REFERENCE SIGNS LIST 1 substrate transfer device
2 process treatment device
3 optical sensor
7 substrate conveying robot
8 casing
15 rail
16 slider
17 actuator
20 treatment device main body
21 casing
22 treatment chamber
24 substrate
25 substrate carrier
31 light projecting portion
32 light receiving portion
33 amplifier unit
34 optical fiber
36 light emitting element
37 light receiving element
38 control board
39 lens unit
51 hand base portion
52 blade
60 container main body
61 container door
69 lifting drive unit
70 lifting shaft
71 robot arm
72 robot hand
72a reference portion
72b movable portion
73 base
74 controller
75, 76 link
77 to 79 horizontal drive unit
80 conveying chamber
81 front wall
82 rear wall
83 side wall
84 ceiling plate
85 bottom plate
86 front opening
87 rear opening
91 load port
92 aligner
93 adjuster
95 opening frame
96 opener door
97 support base
98 opener
100 substrate treatment facility
341 first divided end portion
342 second divided end portion
391 collimate lens
392 condensing lens
511 first member
512 second member
A1 to A3 joint axis
L hand longitudinal direction

The invention claimed is:
1. A substrate transfer device comprising:
a casing configured such that when a certain horizontal direction is defined as a first direction, and another horizontal direction orthogonal to the first direction is defined as a second direction, a size of the casing in the second direction is more than a size of the casing in the first direction, the casing including walls forming a conveying chamber and at least one opening provided at at least one side of the conveying chamber in the first direction; and
a substrate conveying robot including
a base provided in the conveying chamber,
a robot arm constituted by at least one link supported by the base,
a robot hand coupled to a wrist portion of the robot arm and configured to hold a substrate, and
a controller configured to control operations of the robot arm and the robot hand, wherein the robot hand includes:
a reference portion coupled to the wrist portion of the robot arm;
a movable portion coupled to the reference portion so as to be displaceable relative to the reference portion; and
a movement mechanism configured to displace the movable portion relative to the reference portion, and
when a space in the conveying chamber except for a predetermined exclusive region is defined as an effective conveying chamber, an entire link length of the at least one link is less than a size of the conveying chamber in the first direction, and an entire hand length of the robot hand is not less than a size of the effective conveying chamber in the first direction.

2. The substrate transfer device according to claim 1 wherein:
the robot hand includes
a hand base portion coupled to the wrist portion of the robot arm, and
a blade coupled to the hand base portion and configured to hold the substrate; and
the reference portion is constituted by a part of the hand base portion, and the movable portion is constituted by a remaining part of the hand base portion and the blade.

3. The substrate transfer device according to claim 1, wherein:
the robot hand includes
a hand base portion coupled to the wrist portion of the robot arm, and
a blade coupled to the hand base portion and configured to hold the substrate; and
the reference portion is constituted by the hand base portion, and the movable portion is constituted by the blade.

4. The substrate transfer device according to claim 1, wherein the movable portion is coupled to the reference portion so as to be displaceable toward and away from the reference portion in the longitudinal direction of the robot hand.

5. The substrate transfer device according to claim 1, wherein the movable portion is coupled to the reference portion so as to be rotationally displaceable relative to the reference portion in a substantially vertical direction.

6. The substrate transfer device according to claim 1, wherein the movable portion is coupled to the reference portion so as to be rotationally displaceable relative to the reference portion in a substantially horizontal direction.

7. The substrate transfer device according to claim 1, wherein:
the robot hand further includes at least one optical sensor; and
the optical sensor includes
a light projecting portion and light receiving portion provided at the movable portion,
an amplifier unit provided at the reference portion,
an optical fiber coupling the light projecting portion and the amplifier unit and another optical fiber coupling the light receiving portion and the amplifier unit, at least one of the optical fibers including a pair of divided end portions that are a first divided end portion provided at the reference portion and a second divided end portion provided at the movable portion, and
a lens unit optically coupling the first divided end portion and the second divided end portion.

8. The substrate transfer device according to claim 7, wherein the lens unit includes:
a collimate lens provided at a light projecting side corresponding to one of the divided end portions of the optical fiber; and
a condensing lens provided at a light receiving side corresponding to the other of the divided end portions of the optical fiber.

9. The substrate transfer device according to claim 1, wherein an entire length of the robot hand is a size of an expanded-state robot hand including the substrate.

* * * * *